(12) United States Patent
Tanitsu

(10) Patent No.: US 8,611,013 B2
(45) Date of Patent: Dec. 17, 2013

(54) OPTICAL INTEGRATOR, ILLUMINATION OPTICAL DEVICE, ALIGNER, AND METHOD FOR FABRICATING DEVICE

(75) Inventor: Osamu Tanitsu, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/797,680

(22) Filed: Jun. 10, 2010

(65) Prior Publication Data

US 2010/0245796 A1 Sep. 30, 2010

Related U.S. Application Data

(60) Division of application No. 12/142,649, filed on Jun. 19, 2008, which is a continuation of application No. PCT/JP2006/322767, filed on Nov. 15, 2006.

(30) Foreign Application Priority Data

Dec. 21, 2005 (JP) .............................. P2005-367647

(51) Int. Cl.
*G02B 27/10* (2006.01)

(52) U.S. Cl.
USPC ............ 359/624; 359/621; 359/622; 359/623

(58) Field of Classification Search
USPC ................. 359/618, 619, 621, 622, 623, 624
See application file for complete search history.

(56) References Cited

U.S. PATENT DOCUMENTS

| RE34,634 E | 6/1994 | Konno et al. |
|---|---|---|
| 5,636,003 A | 6/1997 | Tanitsu et al. |
| 6,212,011 B1 | 4/2001 | Lissotschenko et al. |
| 7,095,560 B2 | 8/2006 | Toyoda et al. |
| 2002/0122250 A1 | 9/2002 | Kobayashi et al. |
| 2004/0104359 A1 | 6/2004 | Komatsuda et al. |
| 2006/0166142 A1 | 7/2006 | Toyoda et al. |
| 2009/0021716 A1 | 1/2009 | Wangler et al. |
| 2009/0021839 A1 | 1/2009 | Wolf et al. |

FOREIGN PATENT DOCUMENTS

| EP | 1 367 446 A1 | 12/2003 |
|---|---|---|
| JP | 62-2540 | 1/1987 |
| JP | 04-084105 | 3/1992 |
| JP | 2003-015314 | 1/2003 |
| JP | 2004-247527 | 9/2004 |
| WO | WO 2005/027207 A1 | 3/2005 |
| WO | WO 2007/093396 A1 | 8/2007 |
| WO | WO 2007/093436 A1 | 8/2007 |

OTHER PUBLICATIONS

Supplementary European Search Report from International Application No. PCT/JP2006/322767, mailed Jun. 24, 2010.
International Search Report from International Application No. PCT/JP2006/322767, mailed Jan. 9, 2007.

*Primary Examiner* — Jack Dinh
(74) *Attorney, Agent, or Firm* — Finnegan, Henderson, Farabow, Garrett & Dunner, L.L.P.

(57) ABSTRACT

An optical integrator is able to keep down a light-quantity loss in modified illumination with an illumination optical apparatus. An optical integrator of a wavefront division type according to the present invention has a plurality of refracting surface regions which refract incident light, and a plurality of deflecting surface regions provided corresponding to the plurality of refracting surface regions and adapted for changing a traveling direction of the incident light. The plurality of refracting surface regions include a plurality of first refracting surface regions includes an arcuate contour with the center projecting in a first direction, and a plurality of second refracting surface regions includes an arcuate contour with the center projecting in a second direction.

31 Claims, 25 Drawing Sheets

(a) A-A SECTION    (b) B-B SECTION (a)

(b)

(a) A-A SECTION   (b) B-B SECTION (a)

(b)

(a)

(b)

(a)

(b)

OPTICAL INTEGRATOR, ILLUMINATION OPTICAL DEVICE, ALIGNER, AND METHOD FOR FABRICATING DEVICE

CROSS-REFERENCE TO RELATED APPLICATIONS

This application is a division of application Ser. No. 12/142,649, filed Jun. 19, 2009, which is a continuation of International Application No. PCT/JP2006/322767 filed on Nov. 15, 2006, the entire disclosures of which are incorporated herein by reference. International Application No. PCT/JP2006/322767 claims priority to Japanese Patent Application No. 2005-36747 filed on Dec. 21, 2005, the disclosure of which is also incorporated herein by reference.

BACKGROUND

1. Field

One embodiment of the present invention relates to an optical integrator, illumination optical apparatus, exposure apparatus, and device manufacturing method. More particularly, the present invention relates to an optical integrator suitably applicable to illumination optical apparatus in exposure apparatus used for manufacturing such devices as semiconductor devices, imaging devices, liquid-crystal display devices, and thin-film magnetic heads, for example, by lithography.

2. Description of the Related Art

In a typical exposure apparatus of this type, a beam emitted from a light source is guided into a fly's eye lens as an optical integrator of a wavefront division type, to form a secondary light source consisting of a large number of illuminants on or near a rear focal plane of the fly's eye lens. Beams from the secondary light source are guided through an aperture stop disposed on or near the rear focal plane of the fly's eye lens, to be limited, and they are then incident to a condenser lens. The aperture stop limits the shape or size of the secondary light source to a desired shape or size in accordance with a desired illumination condition (exposure condition).

The beams condensed by the condenser lens illuminate a mask with a predetermined pattern therein in a superimposed manner. Light transmitted by the pattern of the mask travels through a projection optical system to form an image thereof on a wafer. In this manner, the mask pattern is projected (or transferred) onto the wafer to effect exposure thereof. Sine the pattern formed in the mask is a highly integrated pattern, a uniform illuminance distribution must be achieved on the wafer in order to accurately transfer this microscopic pattern onto the wafer.

A conventional technique proposed for improving illuminance uniformity on the wafer is a configuration in which two fly's eye lenses are arranged in tandem in the illumination optical apparatus for illuminating the mask, i.e., a double fly's eye configuration. The double fly's eye configuration described in U.S. Reissued Pat. No. 34,634.

In recent years, attention is being directed toward modified illumination techniques in which the aperture stop located on the exit side of the fly's eye lens has an aperture (light transmitting portion) set in an annular or multi-pole (dipole, quadrupole, or the like) shape to limit the shape of the secondary light source to the annular or multi-pole shape, thereby improving the depth of focus and the resolving power of the projection optical system. In the conventional technology of the double fly's eye configuration, a rectangular illumination field is formed on the entrance surface of the second fly's eye lens by action of the first fly's eye lens (light-source-side fly's eye lens) and the secondary light source of the rectangular shape is similarly formed on or near the rear focal plane of the second fly's eye lens.

For implementing the modified illumination (annular illumination or multi-pole illumination) in this case, the beams from the relatively large rectangular secondary light source fouled by the second fly's eye lens are limited by the aperture stop having the aperture of an annular shape or multi-pole shape. Namely, the conventional technology had the problem that the aperture stop blocked a considerable amount of the beams from the secondary light source in the modified illumination, without contribution to illumination (exposure), and the light-quantity loss at the aperture stop caused reduction in illuminance on the mask and on the wafer and, in turn, reduction in throughput as exposure apparatus.

An object of the invention is to provide an optical integrator capable of keeping down the light-quantity loss, for example, in the modified illumination with illumination optical apparatus. Another object of the present invention is to provide an illumination optical apparatus capable of illuminating an illumination target surface under a desired illumination condition, using the optical integrator capable of keeping down the light-quantity loss in the modified illumination. Still another object of the present invention is to provide an exposure apparatus and device manufacturing method capable of implementing good exposure under a desired illumination condition, using the illumination optical apparatus for illuminating a mask under a desired illumination condition.

SUMMARY

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

A first embodiment of the present invention provides an optical integrator of a wavefront division type comprising:

a plurality of refracting surface regions which refract incident light, wherein the plurality of refracting surface regions comprise a plurality of first refracting surface regions including an arcuate contour with the center projecting in a first direction, and a plurality of second refracting surface regions including an arcuate contour with the center projecting in a second direction different from the first direction.

A second embodiment of the present invention provides an optical integrator of a wavefront division type which forms a far field pattern of a predetermined shape on the basis of incident light, comprising:

a plurality of wavefront dividing regions which divide a wavefront of the incident light, wherein the plurality of wavefront dividing regions comprise a plurality of first wavefront dividing regions including an arcuate contour with the center projecting in a first direction, and a plurality of second wavefront dividing regions including an arcuate contour with the center projecting in a second direction different from the first direction.

A third embodiment of the present invention provides an optical integrator of a wavefront division type which forms a far field pattern of a predetermined shape on the basis of incident light, comprising:

a plurality of refracting surface regions which refract the incident light, and a plurality of deflecting surface regions provided corresponding to the plurality of refracting surface regions and adapted for changing a traveling direction of the incident light, wherein the far field pattern is formed by a beam including passed through the refracting surface regions and the deflecting surface regions and is localized in an annular region, and wherein a direction of polarization of the beam to form the far field pattern is set in a circumferential direction of the annular region.

A fourth embodiment of the present invention provides a method for manufacturing an optical integrator of a wavefront division type, comprising:

preparing an optically transparent substrate; and forming a plurality of wavefront dividing regions in a surface of the optically transparent substrate, wherein the forming the plurality of wavefront dividing regions comprises:

forming a plurality of first wavefront dividing regions including an arcuate contour with the center projecting in a first direction, and forming a plurality of second wavefront dividing regions including an arcuate contour with the center projecting in a second direction different from the first direction.

A fifth embodiment of the present invention provides an illumination optical apparatus which illuminates an illumination target surface on the basis of light from a light source, comprising:

the optical integrator of any one of the first aspect to the third aspect disposed in an optical path between the light source and the illumination target surface, or the optical integrator manufactured by the manufacturing method of the fourth embodiment.

A sixth embodiment of the present invention provides an exposure apparatus comprising the illumination optical apparatus of the fifth embodiment which illuminates a predetermined pattern, the exposure apparatus being adapted to effect exposure of a photosensitive substrate with the predetermined pattern. A seventh embodiment of the present invention provides a device manufacturing method comprising: exposing the photosensitive substrate with the predetermined pattern, using the exposure apparatus of the sixth embodiment; and developing the photosensitive substrate after the exposing.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION OF THE EMBODIMENTS

Figure 1:
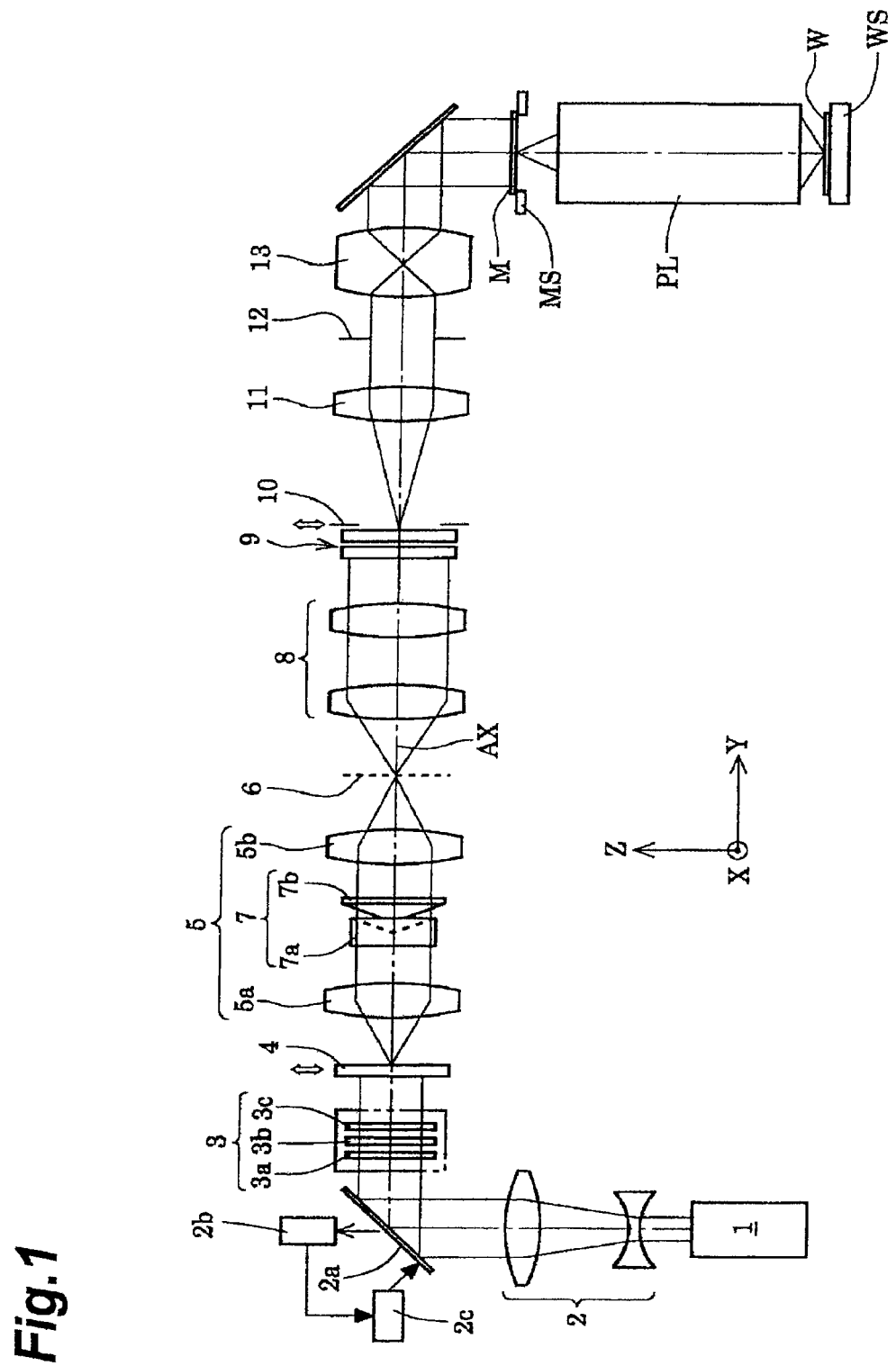
FIG. 1 is a drawing schematically showing a configuration of an exposure apparatus according to an embodiment of the present invention.

Embodiments of the present invention will be described on the basis of the accompanying drawings. FIG. 1 is a drawing schematically showing a configuration of an exposure apparatus according to an embodiment of the present invention. In FIG. 1, the Z-axis is set along a direction of a normal to a wafer W being a photosensitive substrate, the Y-axis along a direction parallel to the plane of FIG. 1 in a surface of the wafer W, and the X-axis along a direction normal to the plane of FIG. 1 in the surface of the wafer W. With reference to FIG. 1, the exposure apparatus of the present embodiment has a light source 1 for supplying exposure light (illumination light).

The light source 1 can be, for example, an ArF excimer laser light source for supplying light at the wavelength of 193 nm, a KrF excimer laser light source for supplying light at the wavelength of 248 nm, or the like. Light emitted from the light source 1 is expanded into a beam of a required sectional shape by a shaping optical system 2, travels via an automatic axis tracking unit 2a-2c, thereafter travels through a polarization state switch 3 and a micro fly's eye lens 4 for multi-pole illumination (dipole illumination, quadrupole illumination, or the like), and is then incident to an afocal lens 5. A detailed configuration and action of the micro fly's eye lens 4 for multi-pole illumination will be described later.

The automatic axis tracking unit is composed of at least one path folding mirror 2a having two or more rotation axes, an angular deviation detector 2b for detecting an angular deviation from the optical axis of the light from the light source 1, and a driver 2c for rotating (or inclining) the path folding mirror 2a so as to correct the angular deviation, based on an output from the angular deviation detector 2b, and has a function to keep the angular deviation of light incident to the micro fly's eye lens 4 described below, within a predetermined permissible range.

The polarization state switch 3 is provided with the following components arranged in the order named from the light source side: a quarter wave plate 3a a crystal optic axis of which is arranged as rotatable around the optical axis AX and which converts elliptically polarized light incident thereinto, into linearly polarized light; a half wave plate 3b a crystal optic axis of which is arranged as rotatable around the optical axis AX and which changes a direction of polarization of the linearly polarized light incident thereinto; a depolarizer (depolarizing element) 3c which can be set in or off an illumination optical path. The polarization state switch 3, in a state in which the depolarizer 3c is set off the illumination optical path, has a function to convert the light from the light source 1 into linearly polarized light with a desired polarization direction and let the linearly polarized light into the micro fly's eye lens 4, and, in a state in which the depolarizer 3c is set in the illumination optical path, has a function to convert the light from the light source 1 into substantially unpolarized light and let the unpolarized light into the micro fly's eye lens 4.

The afocal lens 5 is an afocal system (afocal optic) so set that a front focal position of a front lens unit 5a thereof is approximately coincident with a position of the micro fly's eye lens 4 and that a rear focal position of a rear lens unit 5b thereof is approximately coincident with a position of a predetermined plane 6 indicated by a dashed line in the drawing. The micro fly's eye lens 4 for multi-pole illumination, as described later, functions as an optical integrator of a wavefront division type and, when a parallel beam of a rectangular cross section is incident thereinto, it functions to form a light intensity distribution of a multi-pole shape (dipole shape, quadrupole shape, or the like) on the pupil plane of the afocal lens 5.

Therefore, a nearly parallel beam incident into the micro fly's eye lens 4 forms a light intensity distribution of a multi-pole shape on the pupil plane of the afocal lens 5 and is then emitted in an angular distribution of the multi-pole shape from the afocal lens 5. A conical axicon system 7 is disposed on or near the pupil plane in the optical path between the front lens unit 5a and the rear lens unit 5b of the afocal lens 5. A configuration and action of the conical axicon system 7 will be described later.

Figure 2:
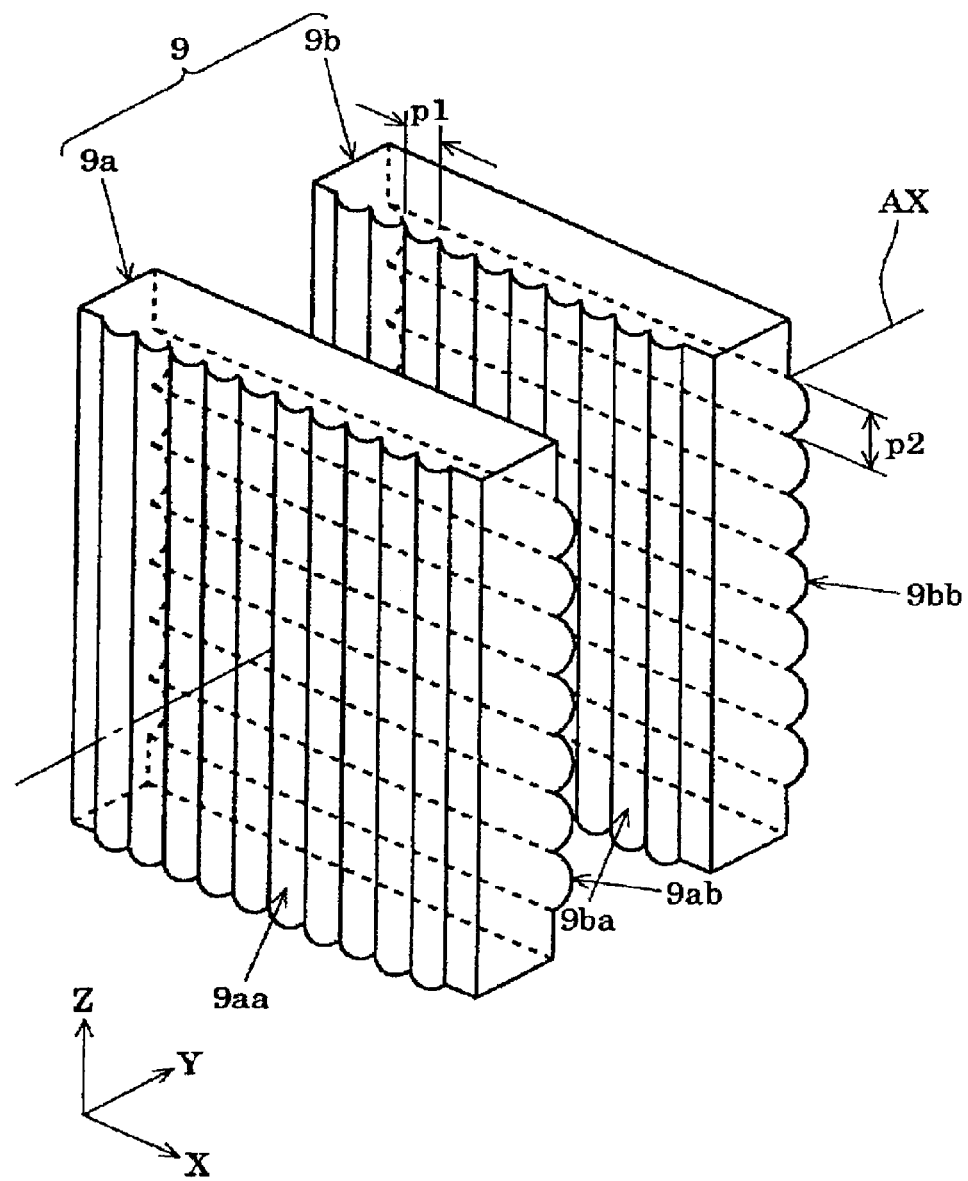
FIG. 2 is a perspective view schematically showing configuration of a cylindrical micro fly's eye lens.

The beam passing through the afocal lens 5 travels through a zoom lens 8 for variation in σ-value (σ value=mask-side numerical aperture of illumination optical apparatus/mask-side numerical aperture of projection optical system) to enter a cylindrical micro fly's eye lens 9. The cylindrical micro fly's eye lens 9, as shown in FIG. 2, is composed of a first fly's eye member 9a disposed on the light source side, and a second fly's eye member 9b disposed on the mask side. Cylindrical lens groups 9aa and 9ba arrayed in the X-direction are formed each at a pitch p1 in a light-source-side surface of the first fly's eye member 9a and in a light-source-side surface of the second fly's eye member 9b, respectively.

On the other hand, cylindrical lens groups 9ab and 9bb arrayed in the Z-direction are formed each at a pitch p2 (p2>p1) in a mask-side surface of the first fly's eye member 9a and in a mask-side surface of the second fly's eye member 9b, respectively. When attention is focused on refraction in the X-direction (or refraction in the XY plane) of the cylindrical micro fly's eye lens 9, a parallel beam incident along the optical axis AX is wavefront-divided at the pitch p1 along the X-direction by the cylindrical lens group 9aa formed on the light source side of the first fly's eye member 9a and is condensed by its refracting surface, and thereafter divided wavefront sections are condensed by refracting surfaces of the corresponding cylindrical lenses in the cylindrical lens group 9ba formed on the light source side of the second fly's eye member 9b, to be converged on the rear focal plane of the cylindrical micro fly's eye lens 9.

On the other hand, when attention is focused on refraction in the Z-direction (or refraction in the YZ plane) of the cylindrical micro fly's eye lens 9, the parallel beam incident along the optical axis AX is wavefront-divided at the pitch p2 along the Z-direction by the cylindrical lens group 9ab formed on the mask side of the first fly's eye member 9a and condensed by its refracting surface, and thereafter divided wavefront sections are condensed by refracting surfaces of the corresponding cylindrical lenses in the cylindrical lens group 9bb formed on the mask side of the second fly's eye member 9b, to be converged on the rear focal plane of the cylindrical micro fly's eye lens 9.

As described above, the cylindrical micro fly's eye lens 9 is composed of the first fly's eye member 9a and the second fly's eye member 9b each of which has the cylindrical lens groups disposed on both side faces, and exhibits an optical function similar to that of a micro fly's eye lens in which a large number of rectangular microscopic refracting surfaces having the size of p1 in the X-direction and the size of p2 in the Z-direction are integrally formed vertically and horizontally and densely. With the cylindrical micro fly's eye lens 9, it is feasible to hold down change in distortion due to variation in surface shape of microscopic refracting surfaces, e.g., to keep down influence of a manufacturing error of the large number of microscopic refracting surfaces integrally formed by etching, on the illuminance distribution.

The position of the predetermined plane 6 is located near the front focal position of the zoom lens 8 and the entrance surface of the cylindrical micro fly's eye lens 9 is located near the rear focal position of the zoom lens 8. In other words, the zoom lens 8 keeps the predetermined plane 6 and the entrance surface of the cylindrical micro fly's eye lens 9 substantially in the Fourier transform relation and, therefore, keeps the pupil plane of the afocal lens 5 optically substantially conjugate with the entrance surface of the cylindrical micro fly's eye lens 9.

Accordingly, for example, an illumination field of a multi-pole shape centered on the optical axis AX is formed on the entrance surface of the cylindrical micro fly's eye lens 9 as on the pupil plane of the afocal lens 5. The overall shape of this illumination field of a multi-pole shape similarly varies depending upon the focal length of the zoom lens 8. The rectangular microscopic refracting surfaces as wavefront division units in the cylindrical micro fly's eye lens 9 are similar to a shape of an illumination field to be formed on the mask M (or a shape of an exposure region to be formed on the wafer W eventually).

A beam incident into the cylindrical micro fly's eye lens 9 is two-dimensionally divided and a secondary light source having a light intensity distribution substantially identical with the illumination field formed by the incident beam, i.e., a secondary light source consisting of substantial surface illuminants of the multi-pole shape centered on the optical axis AX is formed on or near the rear focal plane of the cylindrical micro fly's eye lens 9 (therefore, on an illumination pupil). Beams from the secondary light source formed on or near the rear focal plane of the cylindrical micro fly's eye lens 9 are then incident to an aperture stop 10 disposed near it.

The aperture stop 10 has an aperture (light transmitting portion) of a multi-pole shape corresponding to the secondary light source of the multi-pole shape formed on or near the rear focal plane of the cylindrical micro fly's eye lens 9. The aperture stop 10 is so arranged that it can be set in or off the illumination optical path and that it can be switched to one of other aperture stops with an aperture different in size and shape. The aperture stops can be switched, for example, by such a method as a well-known turret method or slide method. The aperture stop 10 is located at a position optically substantially conjugate with an entrance pupil plane of a projection optical system PL described below, to define a range of contribution of the secondary light source to illumination.

Light beams from the secondary light source limited by the aperture stop 10 travel through a condenser optical system 11 to illuminate a mask blind 12 in a superimposed manner. In this manner, a rectangular illumination field according to the shape and focal length of the rectangular microscopic refracting surfaces as wavefront division units in the cylindrical micro fly's eye lens 9 is formed on the mask blind 12 as an illumination field stop. The beams passing through a rectangular aperture (light transmitting portion) of the mask blind 12 are condensed by an imaging optical system 13 to illuminate the mask M with a predetermined pattern therein in a superimposed manner. Namely, the imaging optical system 13 forms an image of the rectangular aperture of the mask blind 12 on the mask M.

A beam transmitted by the pattern of the mask M held on a mask stage MS travels through the projection optical system PL to form an image of the mask pattern on the wafer (photosensitive substrate) W held on a wafer stage WS. In this configuration, the pattern of the mask M is sequentially transferred into each of exposure areas on the wafer W by carrying out one-shot exposure or scan exposure while two-dimensionally driving and controlling the wafer stage WS and, therefore, two-dimensionally driving and controlling the wafer W in the plane (XY plane) perpendicular to the optical axis AX of the projection optical system PL.

Modified illuminations of various forms can be implemented, for example, by setting a micro fly's eye lens with an appropriate property like a micro fly's eye lens for annular illumination or a micro fly's eye lens for circular illumination in the illumination optical path, instead of the micro fly's eye lens 4 for multi-pole illumination. The micro fly's eye lens can be switched to another, for example, by such a method as the well-known turret method or slide method.

The conical axicon system 7 is composed of a first prism member 7a with a plane on the light source side and a refracting surface of a concave conical shape on the mask side, and a second prism member 7b with a plane on the mask side and a refracting surface of a convex conical shape on the light source side, which are arranged in order from the light source side. The refracting surface of the concave conical shape of the first prism member 7a and the refracting surface of the convex conical shape of the second prism member 7b are complementarily formed so as to abut on each other. At least one of the first prism member 7a and the second prism member 7b is arranged as movable along the optical axis AX to make the distance variable between the refracting surface of the concave conical shape of the first prism member 7a and the refracting surface of the convex conical shape of the second prism member 7b. For easier understanding, the action of the conical axicon system 7 and the action of the zoom lens 8 will be described with focus on the secondary light source of an annular shape or quadrupole shape.

In a state in which the concave conical refracting surface of the first prism member 7a and the convex conical refracting surface of the second prism member 7b are in contact with each other, the conical axicon system 7 functions as a plane-parallel plate and has no effect on the annular or quadrupolar secondary light source formed. However, as the concave conical refracting surface of the first prism member 7a is separated away from the convex conical refracting surface of the second prism member 7b, the outside diameter (inside diameter) of the annular or quadrupolar secondary light source varies while the width of the annular or quadrupolar secondary light source (half of a difference between the outside diameter and the inside diameter of the annular secondary light source; half of a difference between a diameter (outside diameter) of a circle circumscribed to the quadrupolar secondary light source and a diameter (inside diameter) of a circle inscribed in the quadrupolar secondary light source) is kept constant. Namely, the separation results in varying the annular ratio (inside diameter/outside diameter) and the size (outside diameter) of the annular or quadrupolar secondary light source.

The zoom lens 8 has a function to similarly enlarge or reduce the overall shape of the annular or quadrupolar secondary light source. For example, when the focal length of the zoom lens 8 is increased from a minimum to a predetermined value, the overall shape of the annular or quadrupolar secondary light source is similarly enlarged. In other words, the action of the zoom lens 8 is to vary both the width and size (outside diameter), without change in the annular ratio of the annular or quadrupolar secondary light source. In this manner, the annular ratio and size (outside diameter) of the annular or quadrupolar secondary light source can be controlled by the actions of the conical axicon system 7 and the zoom lens 8.

Figure 3:
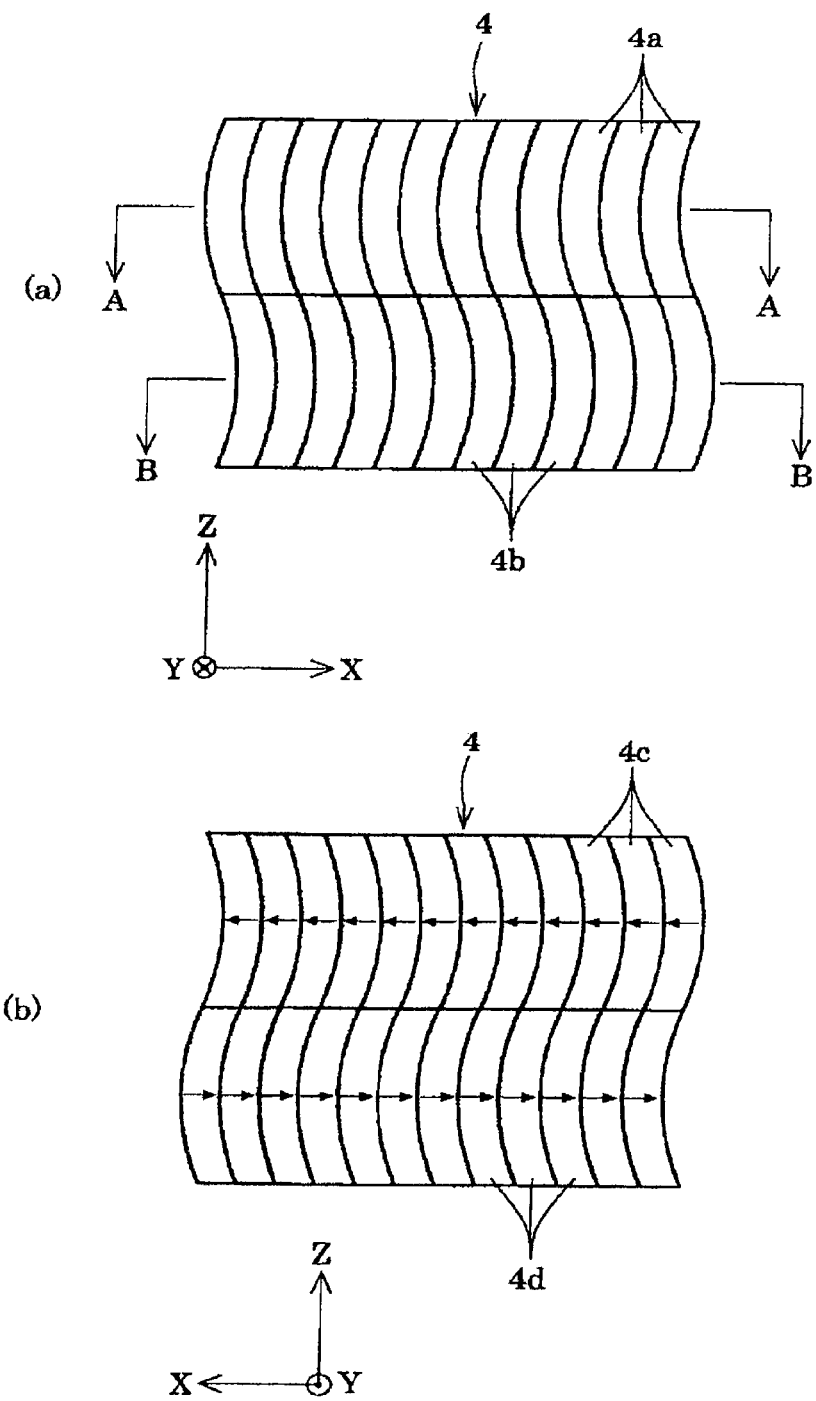
FIG. 3 is a drawing schematically showing a configuration of a micro fly's eye lens for dipole illumination according to the embodiment, wherein (a) is a view from the light source side and (b) a view from the mask side.

FIG. 3 is a drawing schematically showing a configuration of a micro fly's eye lens for dipole illumination according to the present embodiment, wherein (a) is a view from the light source side and (b) a view from the mask side. FIG. 4(a) is a sectional view along line A-A in FIG. 3(a) and FIG. 4(b) a sectional view along line B-B in FIG. 3(a). The micro fly's eye lens 4 for dipole illumination in the present embodiment is constructed as a single optical member (optically transparent member) made, for example, of fluorite ($CaF_2$: calcium fluoride).

The following refracting surface regions are formed on the entrance side (light source side) of the micro fly's eye lens 4, as shown in FIG. 3(a): a large number of first refracting surface regions 4a having an arcuate contour with the center projecting in the −X-direction (first direction); and a large number of second refracting surface regions 4b having an arcuate contour with the center projecting in the +X-direction (second direction). Each of the arcuate contours of the first refracting surface regions 4a and the second refracting surface regions 4b corresponds to a contour of a partial region along a circumferential direction of an annular region.

More specifically, the arcuate contour of the first refracting surface regions 4a and the second refracting surface regions 4b, as described below with reference to FIG. 5, corresponds to an arcuate contour defined by two parallel line segments (corresponding to 20e, 20f in FIG. 5) separated by an equal distance from a center of an annular region, an inside circle of the annular region (corresponding to 20d in FIG. 5), and an outside circle of the annular region (corresponding to 20c in FIG. 5). It is, however, noted that when the arcuate contour defined by the two line segments and two circles is faithfully applied to the refracting surface regions 4a, 4b, the refracting surface regions 4a, 4b cannot be closely packed along the X-direction, different from the closely packed arrangement shown in FIG. 3(a), because the curvature of the inside arc is slightly different from that of the outside arc.

For easier understanding of the configuration, it is assumed in the present embodiment that the arcuate contour of each refracting surface region 4a, 4b is not one faithfully corresponding to a contour of a partial region along the circumferential direction of the annular region, but is an arcuate contour obtained by making the curvature of the inside arc coincident with that of the outside arc or by making the curvature of the outside arc coincident with that of the inside arc, from an arcuate shape as a part of the annular region. In passing, in a case where the faithful arcuate contour obtained from the annular region is applied to the refracting surface regions 4a, 4b, a small crescent region between two refracting surface regions adjacent to each other along the X-direction is formed as a shield region covered by a light blocking material, e.g., chromium.

Each refracting surface region 4a, 4b has a convex shape (or concave shape) and has a function to refract incident light. In general, the surface shape of each refracting surface region 4a, 4b can be one of various surface shapes, for example, including a part of a spherical surface, a part of a rotationally symmetric aspherical surface, a part of a rotationally asymmetric aspherical surface (tonic surface or the like), and so on. For simpler description, it is assumed in the present embodiment that each refracting surface region 4a, 4b has, for example, a spherical convex shape symmetric with respect to each center axis parallel to the optical axis AX, as shown in FIGS. 4(a) and (b).

For simpler description, it is also assumed in the present embodiment that the spherical curvature of the first refracting surface regions 4a is equal to that of the second refracting surface regions 4b and that the contour of the first refracting surface regions 4a is equal to the contour of the second refracting surface regions 4b. Namely, the contour of the first refracting surface regions 4a and the contour of the second refracting surface regions 4b are symmetric with respect to the Z-direction (third direction) and, in turn, are opposite to each other along the X-direction. In this case, the first refracting surface regions 4a and the second refracting surface regions 4b are continuously formed and no border line extending in the X-direction actually appears between the first refracting surface regions 4a and the second refracting surface regions 4b. However, a border line is illustrated between the first refracting surface regions 4a and the second refracting surface regions 4b for clarity of the drawing in FIG. 3(a). In the configuration wherein the first refracting surface regions 4a and the second refracting surface regions 4b are continuously formed and wherein there is no level difference between the first refracting surface regions 4a and the second refracting surface regions 4b, it is feasible to reduce (or suppress) occurrence of unwanted light that directly passes through the micro fly's eye lens 4 (or that travels straight to be transmitted).

On the other hand, the following deflecting surface regions are formed on the exit side (mask side) of the micro fly's eye lens 4, as shown in FIG. 3(b): a large number of first deflecting surface regions 4c of an arcuate contour densely arranged along the X-direction so as to correspond to the large number of first refracting surface regions 4a; and a large number of second deflecting surface regions 4d of an arcuate contour densely arranged along the X-direction so as to correspond to the large number of second refracting surface regions 4b. Each deflecting surface region 4c, 4d has a planar shape inclined with respect to the X-direction, and has a function to change a traveling direction of light having passed through each corresponding refracting surface region 4a, 4b.

More specifically, each first deflecting surface region 4c, as shown in FIG. 4(a), has a planar shape with an up slope relative to the +X-direction, i.e., a planar shape inclined so as to be projecting toward the mask side with respect to the +X-direction. On the other hand, each second deflecting surface region 4d, as shown in FIG. 4(b), has a planar shape with an up slope relative to the −X-direction, i.e., a planar shape inclined so as to be projecting toward the mask side with respect to the −X-direction. In other words, each first deflecting surface region 4c has a planar shape defined by a first normal 4ca inclined relative to the X-direction, and each second deflecting surface region 4d has a planar shape defined by a second normal 4da inclined reversely to the first normal 4ca and relative to the X-direction.

In FIG. 3(b), for easier understanding of the configuration, each deflecting surface region 4c, 4d is provided with an arrow for indicating the up slope direction of the planar shape. Namely, each first deflecting surface region 4c is provided with an arrow directed in the +X-direction and each second deflecting surface region 4d is provided with an arrow directed in the −X-direction. For clarity of the drawing, FIG. 3 shows only some of the large number of refracting surface regions 4a, 4b and deflecting surface regions 4c, 4d forming the micro fly's eye lens 4. This also applies to FIG. 6(a), FIG. 7(a), FIG. 8(a), FIG. 9, FIG. 10, FIG. 14, FIG. 16, and FIG. 18 associated with FIG. 3.

The micro fly's eye lens 4 is formed, for example, by physically processing a plane-parallel plate made of fluorite (e.g., micromachining, processing with a die in a high temperature state, or the like). At this time, the plane-parallel plate made of fluorite belonging to the cubic system may be one with the crystal plane {111} directed to the optical axis AX (i.e., to the traveling direction of the incident light to each refracting surface region 4a, 4b). This crystal plane arrangement improves easiness and stability of processing and well suppresses influence of birefringence of fluorite. When the crystal plane arrangement is one with the crystal plane {100} directed to the optical axis AX (i.e., to the traveling direction of the incident light to each refracting surface 4a), it is also feasible to well suppress the influence of birefringence of fluorite.

In the micro fly's eye lens 4 for dipole illumination in the present embodiment, the nearly parallel beam of the rectangular shape incident thereto from the light source 1 is wavefront-divided by the large number of wavefront dividing regions, i.e., the large number of arcuate first refracting surface regions (first wavefront dividing regions) 4a and the large number of arcuate second refracting surface regions (second wavefront dividing regions) 4b. A beam refracted by each first refracting surface region 4a is guided to each corresponding first deflecting surface region 4c and a beam refracted by each second refracting surface region 4b is guided to each corresponding second deflecting surface region 4d.

Beams guided through the respective first refracting surface regions 4a to the respective corresponding first deflecting surface regions 4c and beams guided through the respective second refracting surface regions 4b to the respective corresponding second deflecting surface regions 4d form a light intensity distribution of a dipole shape arranged in the X-direction and in symmetry with respect to the optical axis AX on the pupil plane of the afocal lens 5, in a superimposed manner. In this way, an illumination field of a dipole shape arranged in the X-direction and in symmetry with respect to the optical axis AX is formed on the entrance surface of the cylindrical micro fly's eye lens 9 as on the pupil plane of the afocal lens 5, as described above. Furthermore, a secondary light source of a dipole shape consisting of a pair of substantial surface illuminants 20a and 20b arranged in the X-direction and in symmetry with respect to the optical axis AX, as shown in FIG. 5, is formed on or near the rear focal plane of the cylindrical micro fly's eye lens 9.

The pair of surface illuminants 20a and 20b have an arcuate contour defined by an outside circle 20c of an annular region centered on the optical axis AX, an inside circle 20d of the annular region, and two parallel line segments 20e and 20f separated by an equal distance from the optical axis AX. However, since in the present embodiment the faithful arcuate contour obtained from the annular region is not applied to each refracting surface region 4a, 4b as described above, the pair of surface illuminants 20a and 20b have the contour slightly different from the contour of the arcuate shape defined by the two circles 20c and 20d and the two line segments 20e and 20f.

In this manner, the beams guided through the respective first refracting surface regions 4a to the respective corresponding first deflecting surface regions 4c are deflected by the first deflecting surface regions 4c with the planar shape of the up slope relative to the +X-direction to illuminate a light intensity distribution corresponding to one arcuate surface illuminant 20a among the secondary light source of the dipole shape, in a superimposed manner. The beams guided through the respective second refracting surface regions 4b to the respective corresponding second deflecting surface regions 4d are deflected by the second deflecting surface regions 4d with the planar shape of the up slope relative to the −X-direction to form a light intensity distribution corresponding to the other arcuate surface illuminant 20b among the secondary light source of the dipole shape, in a superimposed manner. For making the light intensity on the surface illuminant 20a substantially coincident with the light intensity on the surface illuminant 20b, the number of first refracting surface regions 4a may be approximately equal to the number of second refracting surface regions 4b.

Figure 5:
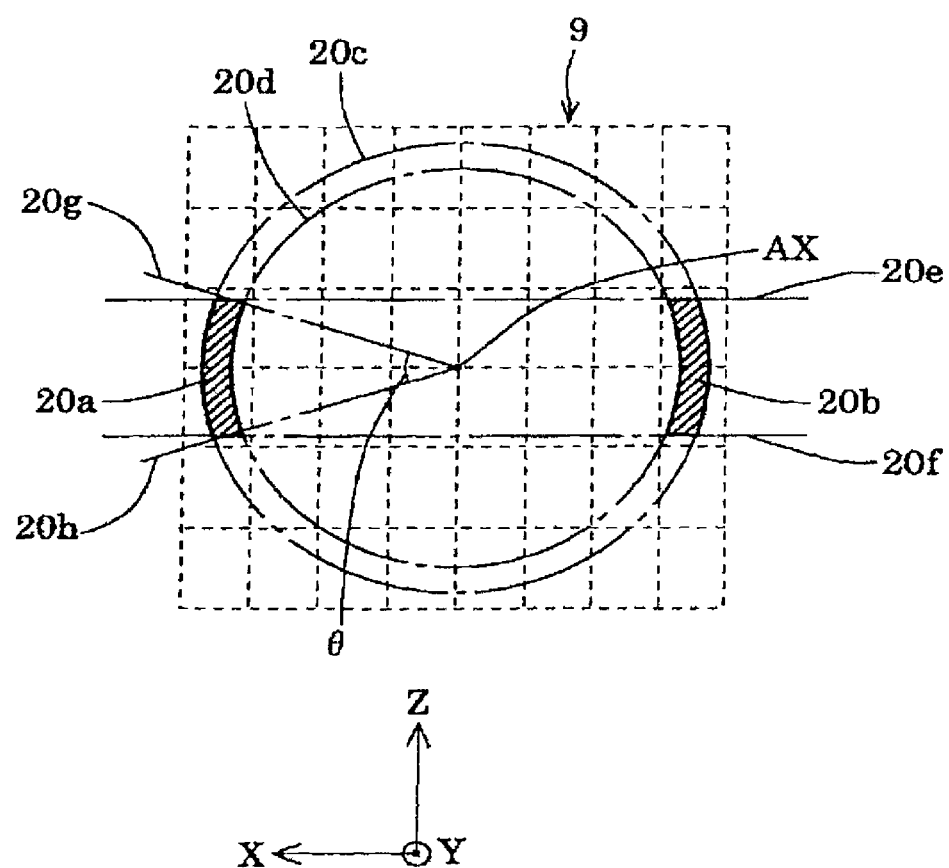
FIG. 5 is a drawing schematically showing a secondary light source of a dipole shape formed on the back of the cylindrical micro fly's eye lens in the embodiment.

In FIG. 5, for clarity of the drawing, the rectangular microscopic refracting surfaces as wavefront division units in the cylindrical micro fly's eye lens 9 are indicated by dashed lines and the number of refracting surfaces depicted is much smaller than the actual number. This also applies to FIG. 6(b), FIG. 7(b), FIG. 8(b), FIG. 12, FIG. 13, FIG. 15(a), and FIG. 17 associated with FIG. 5.

As described above, the micro fly's eye lens 4 for dipole illumination in the present embodiment is provided with the large number of arcuate first refracting surface regions 4a and second refracting surface regions 4b as wavefront dividing regions. It also has the large number of arcuate first deflecting surface regions 4c corresponding to the large number of first refracting surface regions 4a and the large number of arcuate second deflecting surface regions 4d corresponding to the large number of arcuate second refracting surface regions 4b. The arcuate contour of the first refracting surface regions 4a and the arcuate contour of the second refracting surface regions 4b are symmetric with respect to the Z-direction (or opposite to each other along the X-direction), and the first refracting surface regions 4a and second deflecting surface regions 4d have beam deflecting actions opposite to each other along the X-direction.

Accordingly, the beams guided through the respective first refracting surface regions 4a to the respective corresponding first deflecting surface regions 4c and the beams guided through the respective second refracting surface regions 4b to the respective corresponding second deflecting surface regions 4d are deflected by the first deflecting surface regions 4c and by the second deflecting surface regions 4d, respectively, to form the secondary light source of the dipole shape consisting of the pair of arcuate surface illuminants 20a and 20b on or near the rear focal plane of the cylindrical micro fly's eye lens 9. The first surface illuminant 20a is formed in an arcuate first region being a portion along the circumferential direction of the annular region centered on the optical axis AX and the second surface illuminant 20b is formed in an arcuate second region being a portion along the circumferential direction of the annular region and being symmetric with the first region with respect to the optical axis AX.

Namely, the pair of arcuate surface illuminants 20a and 20b constituting the secondary light source of the dipole shape occupy arcuate regions extending along the peripheral edge of the circular illumination pupil centered on the optical axis AX and opposed to each other on both sides of the optical axis AX, and have so-called forms stuck to the peripheral edge of the circular illumination pupil. In this way, the micro fly's eye lens 4 for dipole illumination in the present embodiment has the function to form the far field pattern of the dipole shape having the first region of a portion along the circumferential direction of the annular region and the second region of another portion along the circumferential direction of the annular region, based on the incident light.

As a result, the present embodiment is able to hold down the light-quantity loss at the aperture stop 10, while only a small amount of beams from the secondary light source of the dipole shape (20a, 20b) is blocked by the aperture of the dipole shape of the aperture stop 10. Since in the present embodiment the dipole light intensity distribution of any desired shape is formed by the micro fly's eye lens 4 having the very small wavefront dividing surfaces and the cylindrical micro fly's eye lens 9 having the very small unit wavefront dividing surfaces, the secondary light source of the dipole shape (20a, 20b) does not always have to be limited by the aperture stop 10, according to circumstances.

Since in the present embodiment the pair of arcuate surface illuminants 20a and 20b constituting the secondary light source of the dipole shape have the forms stuck to the peripheral edge of the circular illumination pupil, for example, the mask pattern having the pitch direction in a direction optically corresponding to the X-direction on the illumination pupil can be illuminated with a beam of a high NA corresponding to a maximum numerical aperture (NA) of the illumination optical apparatus and, in turn, the pattern image can be formed with high contrast on the wafer W.

For forming the pattern image with high contrast, the annular ratio of the dipole secondary light source (20a, 20b) (or the diameter of the inside circle 20d/the diameter of the outside circle 20c in FIG. 5) may be set, for example, to 8/10 or more. For forming the pattern image with high contrast and ensuring a sufficient superposition tolerance of beams onto the arcuate surface illuminants 20a, 20b, an angle subtended at the optical axis AX by the arcuate surface illuminants 20a, 20b (or an angle between two line segments 20g and 20h connecting the optical axis AX with the two ends of the arcuate surface illuminant 20a in FIG. 5) θ may be, for example, in the range of approximately 35° to 40°.

In passing, a conventional fly's eye lens having only the wavefront division function forms a secondary light source of a rectangular shape (or a regular hexagonal shape or the like) similar to the shape of the wavefront dividing surfaces of the fly's eye lens. For this reason, for forming the pattern image with high contrast in the conventional technology, it is necessary to limit a beam from the secondary light source of the rectangular shape by an aperture of a dipole shape with a large annular ratio, which results in occurrence of a large light-quantity loss at the aperture stop.

Since in the present embodiment the micro fly's eye lens 4 for dipole illumination is constructed as a single optical member (optically transparent member) made of fluorite, or since the plurality of refracting surface regions 4a, 4b and the plurality of deflecting surface regions 4c, 4d are integrally formed in the single optical member (optically transparent member) made of fluorite, sufficient durability can be ensured even against light (pulsed light) in the ultraviolet region of short wavelengths like the ArF excimer laser light and the KrF excimer laser light. In passing, a conventional fly's eye lens made of silica glass is easily damaged by irradiation energy of light (particularly, pulsed light) in the ultraviolet region of short wavelengths and cannot ensure sufficient durability.

In this manner, the illumination optical apparatus of the present embodiment is able to keep down the light-quantity loss at the aperture stop 10 in the modified illumination such as the dipole illumination and to stably illuminate the mask (illumination target surface) M under a desired illumination condition, using the micro fly's eye lens (optical integrator) 4 with the sufficient durability to light in the ultraviolet region of short wavelengths. The exposure apparatus of the present embodiment is able to stably perform good exposure under a desired illumination condition, using the illumination optical apparatus for stably illuminating the mask M under a desired illumination condition.

In the above-described embodiment, the large number of first refracting surface regions 4a of the arcuate shape with the center projecting in the −X-direction and the large number of second refracting surface regions 4b of the arcuate shape with the center projecting in the +X-direction are densely arranged along the X-direction. Namely, the projecting direction of the center of the first refracting surface regions 4a and the projecting direction of the center of the second refracting surface regions 4b are set opposite to each other along one straight line. However, without having to be limited to this, it is also possible to adopt a configuration example in which the projecting direction of the center of the first refracting surface regions and the projecting direction of the center of the second refracting surface regions are not set opposite to each other along one straight line. In this case, however, the pair of arcuate surface illuminants constituting the secondary light source of the dipole shape are not formed at positions symmetric with respect to the optical axis.

In the above-described embodiment, each of the first refracting surface regions 4a and the second refracting surface regions 4b has the parallel type arcuate contour defined approximately by the two parallel line segments separated by the same distance from the center of the annular region, the inside circle of the annular region, and the outside circle of the annular region. However, without having to be limited to this, the same effect as in the above embodiment is also obtained in a modification example in which a nonparallel type arcuate contour defined approximately by two line segments extending radially at a predetermined angle from the center of the annular region, the inside circle of the annular region, and the outside circle of the annular region is applied to the first refracting surface regions and the second refracting surface regions.

Figure 6:
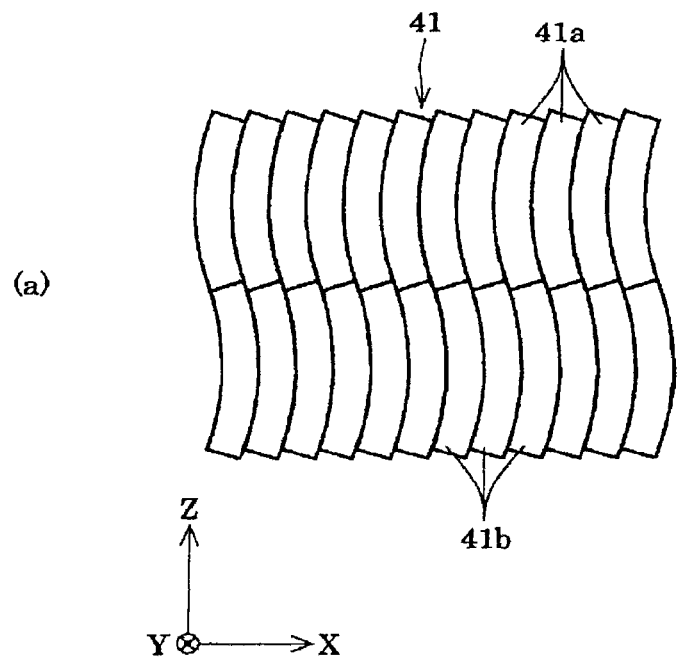
FIG. 6 is a drawing to illustrate a configuration and action of a micro fly's eye lens for dipole illumination in a first modification example.
Figure 6:
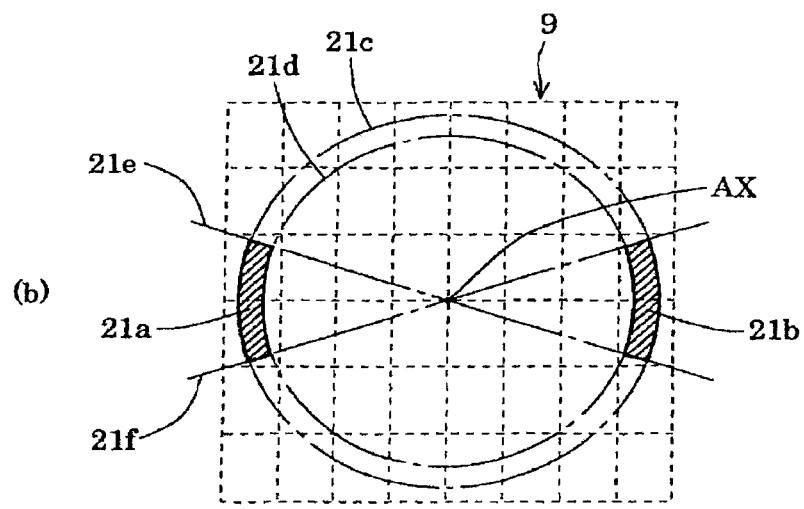
Figure 6:
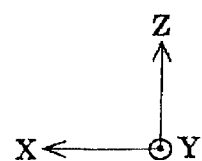

FIG. 6 is a drawing to illustrate a modification example in which the nonparallel type arcuate contour is applied to the first refracting surface regions and the second refracting surface regions. With reference to FIG. 6(a), a micro fly's eye lens 41 for dipole illumination in the first modification example has a large number of first refracting surface regions 41a having a nonparallel type arcuate contour with the center projecting in the −X-direction, and a large number of second refracting surface regions 41b having a nonparallel type arcuate contour with the center projecting in the +X-direction. The micro fly's eye lens 41 also has a large number of nonparallel type arcuate first deflecting surface regions 41c corresponding to the large number of first refracting surface regions 41a, and a large number of nonparallel type arcuate second deflecting surface regions 41d corresponding to the large number of arcuate second refracting surface regions 41b though they are not illustrated in the drawing.

In this manner, the secondary light source of the dipole shape consisting of a pair of nonparallel type arcuate surface illuminants 21a and 21b arranged in the X-direction and in symmetry with respect to the optical axis AX is formed as shown in FIG. 6(b), by action of the micro fly's eye lens 41 in the first modification example. Each of the pair of surface illuminants 21a and 21b has an arcuate, contour defined approximately by an outside circle 21c of an annular region centered on the optical axis AX, an inside circle 21d of the annular region, and two line segments 21e and 21f extending radially from the optical axis AX. In the first modification example, for permitting closely packed arrangement of the first refracting surface regions 41a and the second refracting surface regions 41b along the X-direction, it is also preferable to apply a contour resulting from slight modification of the faithful arcuate shape obtained from the annular region, to the first refracting surface regions 41a and the second refracting surface regions 41b.

Namely, it is preferable to apply to the first refracting surface regions 41a and the second refracting surface regions 41b, an arcuate contour obtained by making the curvature of the inside arc coincident with that of the outside arc or by making the curvature of the outside arc coincident with that of the inside arc, from the arcuate shape defined by the two line segments extending radially from the center of the annular region (corresponding to 21e, 21f in FIG. 6(b)), the inside circle of the annular region (corresponding to 21d in FIG. 6(b)), and the outside circle of the annular region (corresponding to 21c in FIG. 6(b)).

Figure 7:
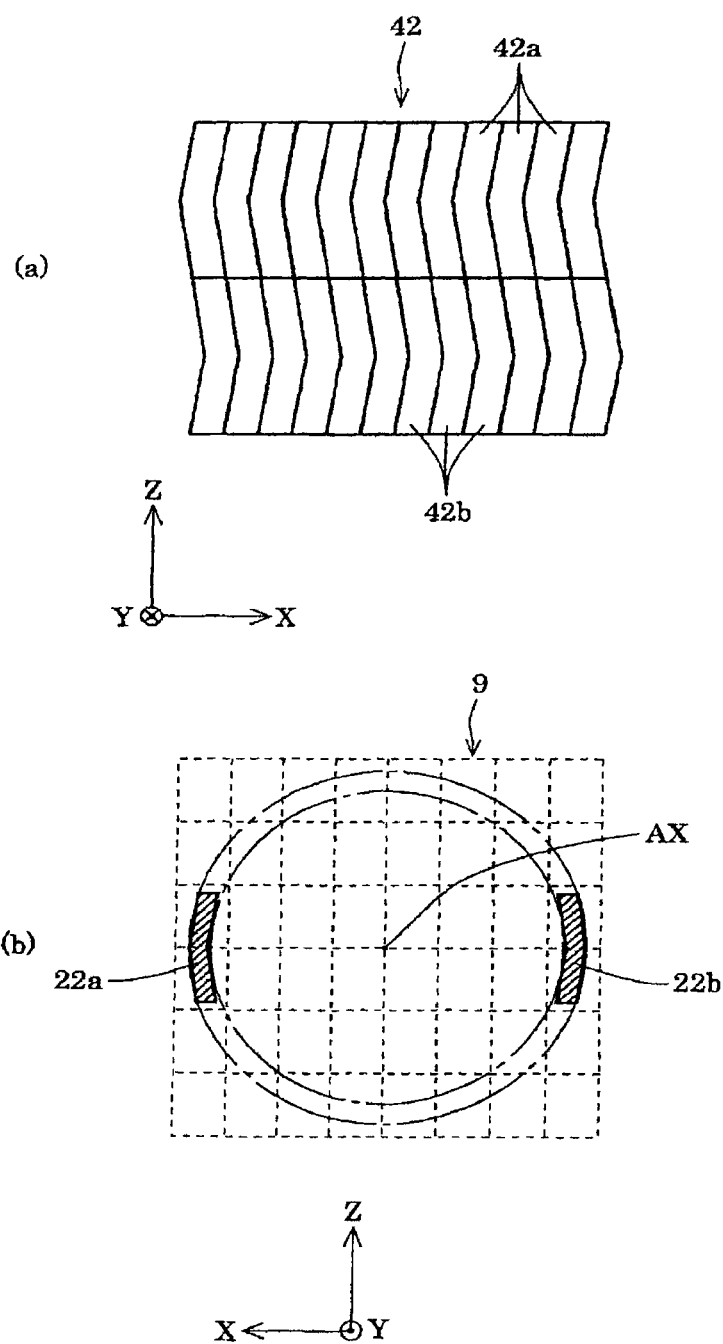
FIG. 7 is a drawing to illustrate a configuration and action of a micro fly's eye lens for dipole illumination in a second modification example.
Figure 8:
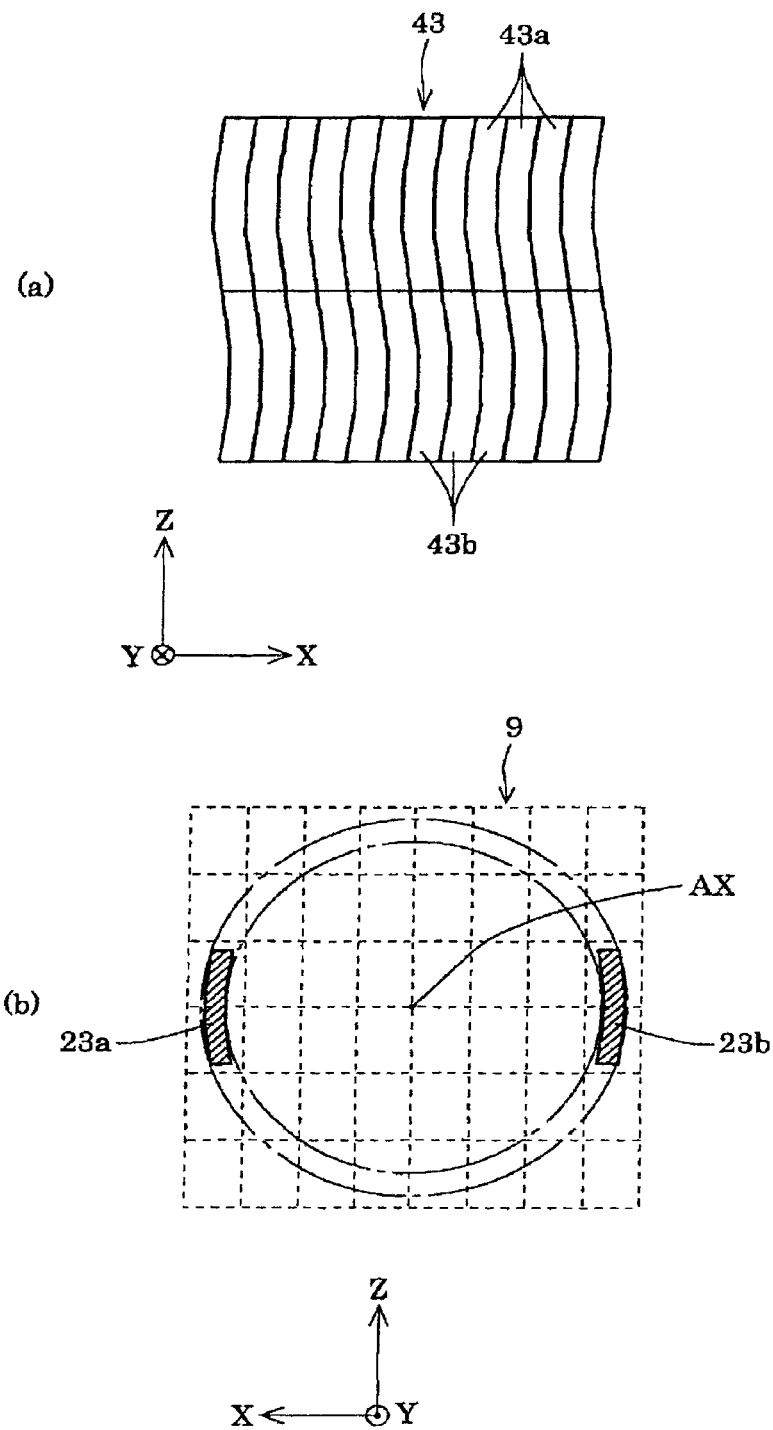
FIG. 8 is a drawing to illustrate a configuration and action of a micro fly's eye lens for dipole illumination in a third modification example.

In the above-described embodiment, each of the first refracting surface regions 4a and the second refracting surface regions 4b has the arcuate contour corresponding to a partial region along the circumferential direction of the annular region. However, without having to be limited to this, it is also possible to apply to at least either of the first refracting surface regions and the second refracting surface regions, generally, an arcuate contour with the center projecting in a predetermined direction, e.g., a contour curved in an arcuate shape or a contour bent in an arcuate shape. Specifically, the same effect as in the aforementioned embodiment is also achieved by applying a contour bent in a chevron shape as shown in FIG. 7 or a contour bent in a compressed chevron shape as shown in FIG. 8, to the first refracting surface regions and the second refracting surface regions.

With reference to FIG. 7(a), a micro fly's eye lens 42 for dipole illumination in the second modification example is arranged so that each of first refracting surface regions 42a and second refracting surface regions 42b has a contour of a hexagonal shape bent in a chevron shape. Accordingly, a secondary light source of a dipole shape consisting of a pair of surface illuminants 22a and 22b of a hexagonal shape bent in a chevron shape as arranged in the X-direction and in symmetry with respect to the optical axis AX is formed as shown in FIG. 7(b), by action of the micro fly's eye lens 42 in the second modification example.

With reference to FIG. 8(a), a micro fly's eye lens 43 for dipole illumination in the third modification example is arranged so that each of first refracting surface regions 43a and second refracting surface regions 43b has a contour of an octagonal shape bent in a compressed chevron shape. Accordingly, a secondary light source of a dipole shape consisting of a pair of surface illuminants 23a and 23b of an octagonal shape bent in a compressed chevron shape as arranged in the X-direction and in symmetry with respect to the optical axis AX is formed as shown in FIG. 8(b), by action of the micro fly's eye lens 43 in the third modification example.

Figure 4:
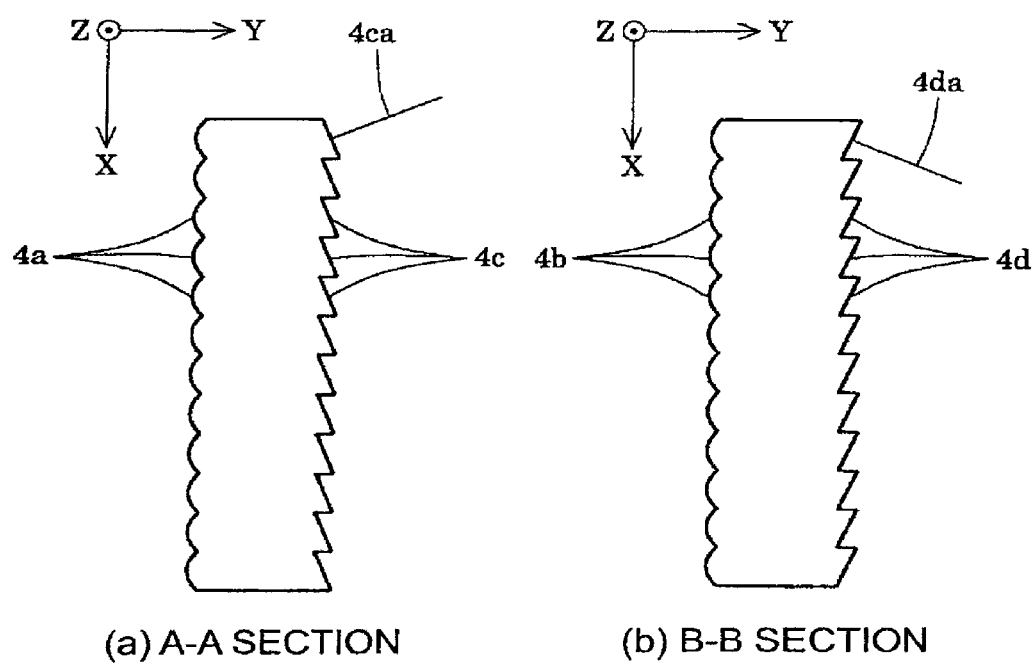
FIG. 4 includes (a) a sectional view along line A-A in FIGS. 3(a) and (b) a sectional view along line B-B in FIG. 3(a).

As described above, a variety of modification examples can be contemplated as to the contours, the number, the arrangement, etc. of the first refracting surface regions and the second refracting surface regions in the micro fly's eye lens 4 for dipole illumination in the embodiment shown in FIGS. 3 to 5.

Figure 9:
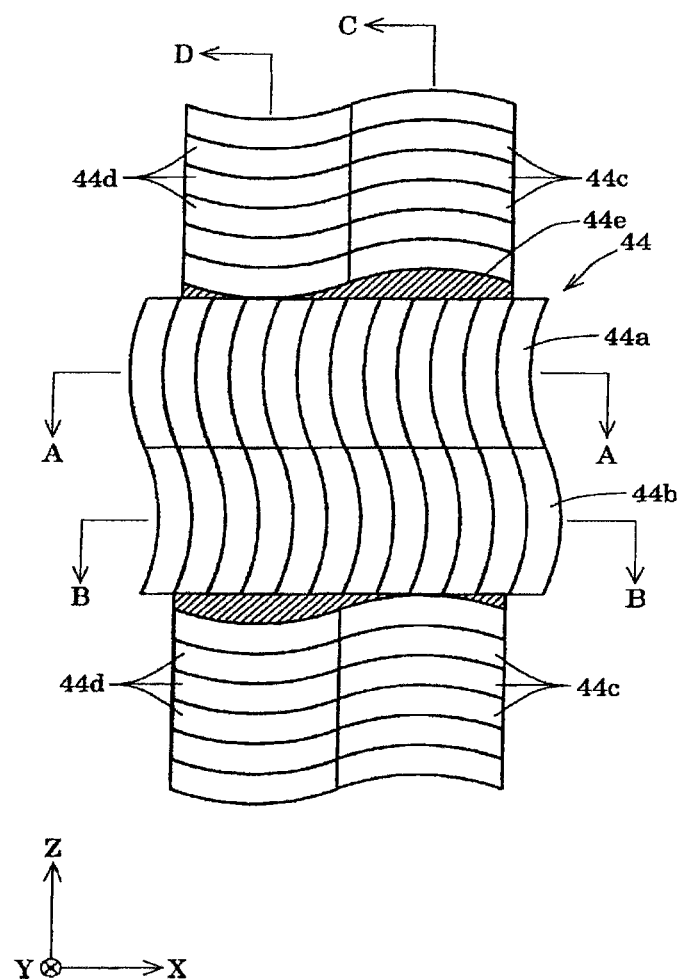
FIG. 9 is a view from the light source side of a micro fly's eye lens for quadrupole illumination in a fourth modification example.

The above description shows the examples of the dipole illumination, but, without having to be limited to it, a micro fly's eye lens for quadrupole illumination can also be implemented based on a configuration similar to that in the embodiment in FIGS. 3 to 5. A micro fly's eye lens for quadrupole illumination in the fourth modification example will be described below with reference to FIGS. 9 to 12. With reference to FIG. 9, the following refracting surface regions are formed on the entrance side (light source side) of the micro fly's eye lens 44 for quadrupole illumination in the fourth modification example: a large number of first refracting surface regions 44a of an arcuate shape with the center projecting in the −X-direction; a large number of second refracting surface regions 44b of an arcuate shape with the center projecting in the +X-direction; a large number of third refracting surface regions 44c of an arcuate shape with the center projecting in the +Z-direction; and a large number of fourth refracting surface regions 44d of an arcuate shape with the center projecting in the −Z-direction.

The first refracting surface regions 44a and the second refracting surface regions 44b have respective configurations corresponding to the first refracting surface regions 4a and the second refracting surface regions 4b in the micro fly's eye lens 4 for dipole illumination shown in FIGS. 3 to 5. The third refracting surface regions 44c have a configuration obtained by rotating the first refracting surface regions 44a by 90° clockwise in the drawing, and the fourth refracting surface regions 44d have a configuration obtained by rotating the second refracting surface regions 44b by 90° clockwise in the drawing. Regions 44e hatched in the drawing are shield regions between the first and second refracting surface regions 44a, 44b and the third and fourth refracting surface regions 44c, 44d.

Figure 10:
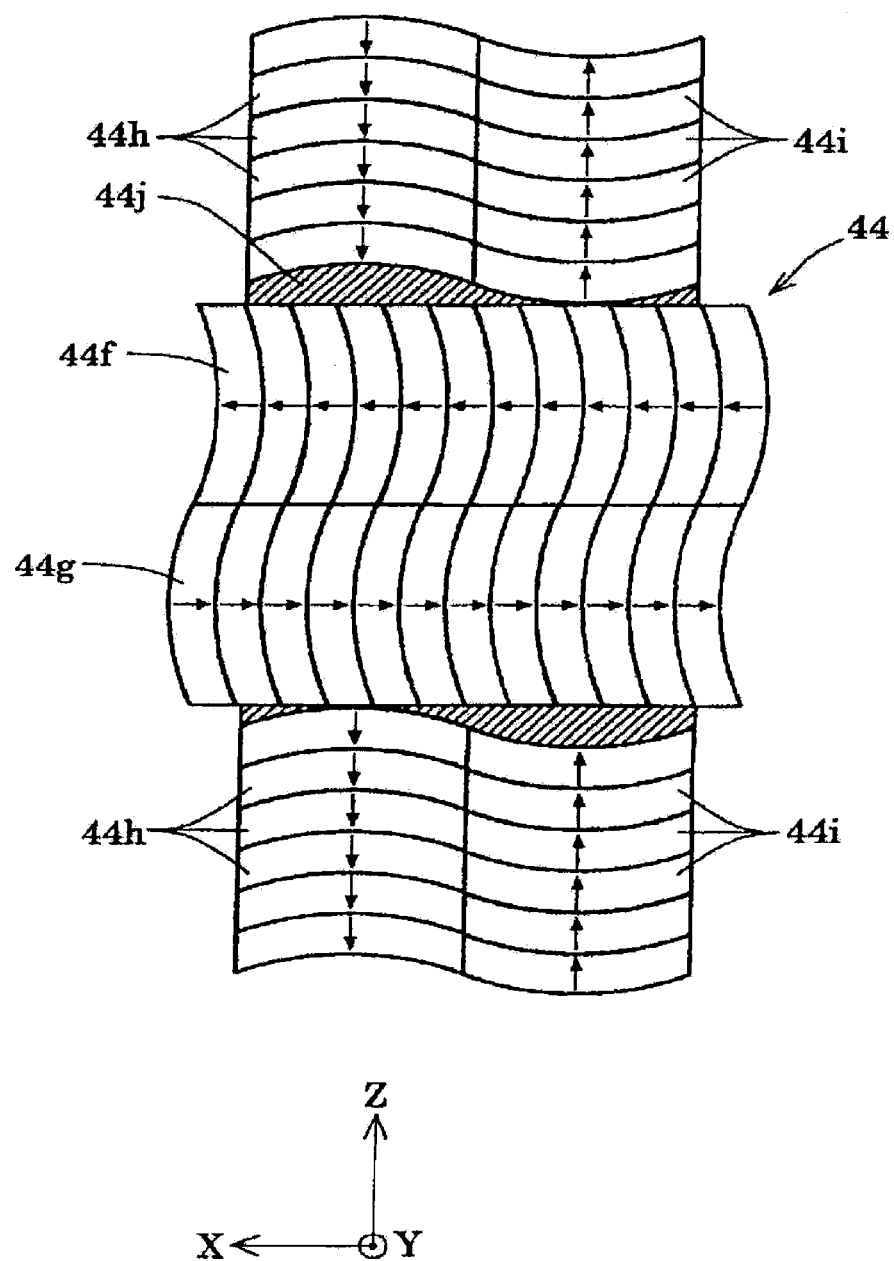
FIG. 10 is a view from the mask side of the micro fly's eye lens for quadrupole illumination in the fourth modification example.

On the other hand, the following deflecting surface regions are formed on the exit side (mask side) of the micro fly's eye lens 44 for quadrupole illumination, as shown in FIG. 10: a large number of arcuate first deflecting surface regions 44f densely arranged along the X-direction corresponding to the large number of first refracting surface regions 44a; a large number of arcuate second deflecting surface regions 44g densely arranged along the X-direction corresponding to the large number of second refracting surface regions 44b; a large number of arcuate third deflecting surface regions 44h densely arranged along the Z-direction corresponding to the large number of third refracting surface regions 44c; a large number of arcuate fourth deflecting surface regions 44i densely arranged along the Z-direction corresponding to the large number of fourth refracting surface regions 44d. Regions 44j hatched in the drawing are shield regions between the first and second deflecting surface regions 44f, 44g and the third and fourth deflecting surface regions 44h, 44i. The exit-side shield regions 44j are provided corresponding to the entrance-side shield regions 44e.

Figure 11:
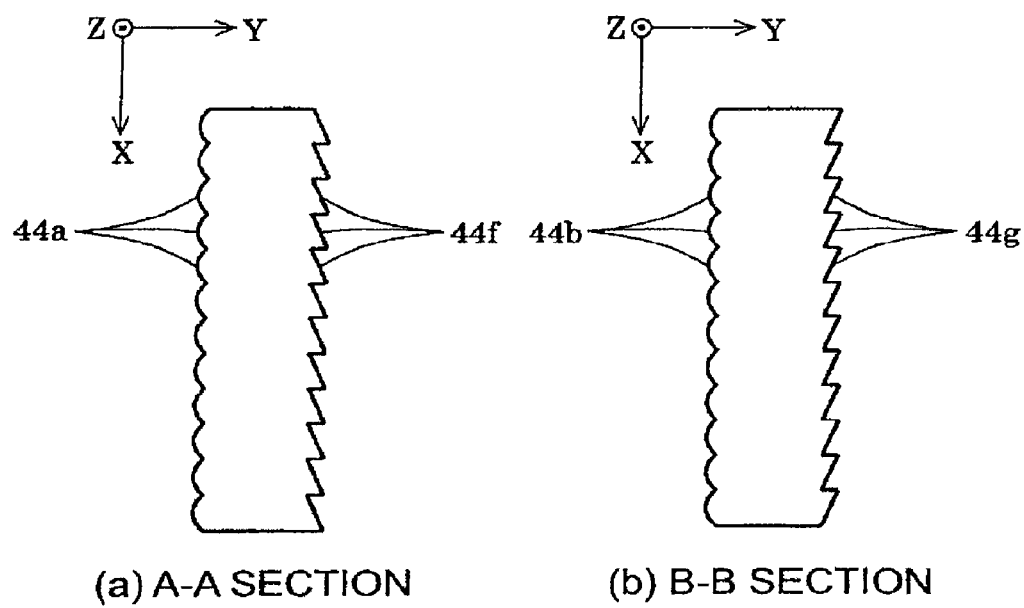
FIG. 11 is sectional views of the micro fly's eye lens for quadrupole illumination in the fourth modification example.
Figure 11:
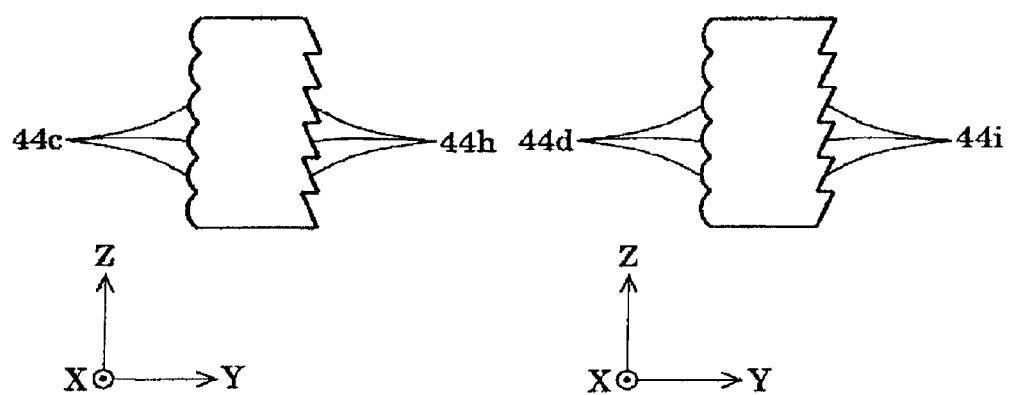

With reference to FIGS. 10 and 11, the first deflecting surface regions 44f have a planar shape with an up slope relative to the +X-direction as the first deflecting surface regions 4c in the micro fly's eye lens 4 for dipole illumination, and the second deflecting surface regions 44g have a planar shape with an up slope relative to the −X-direction as the second deflecting surface regions 4d. The third deflecting surface regions 44h have a configuration obtained by rotating the first deflecting surface regions 44f by 90° counterclockwise in the drawing, and the fourth deflecting surface regions 44i have a configuration obtained by rotating the second deflecting surface regions 44g by 90° counterclockwise in the drawing. Namely, the third deflecting surface regions 44h have a planar shape with an up slope relative to the −Z-direction and the fourth deflecting surface regions 44i have a planar shape with an up slope relative to the +Z-direction.

Figure 12:
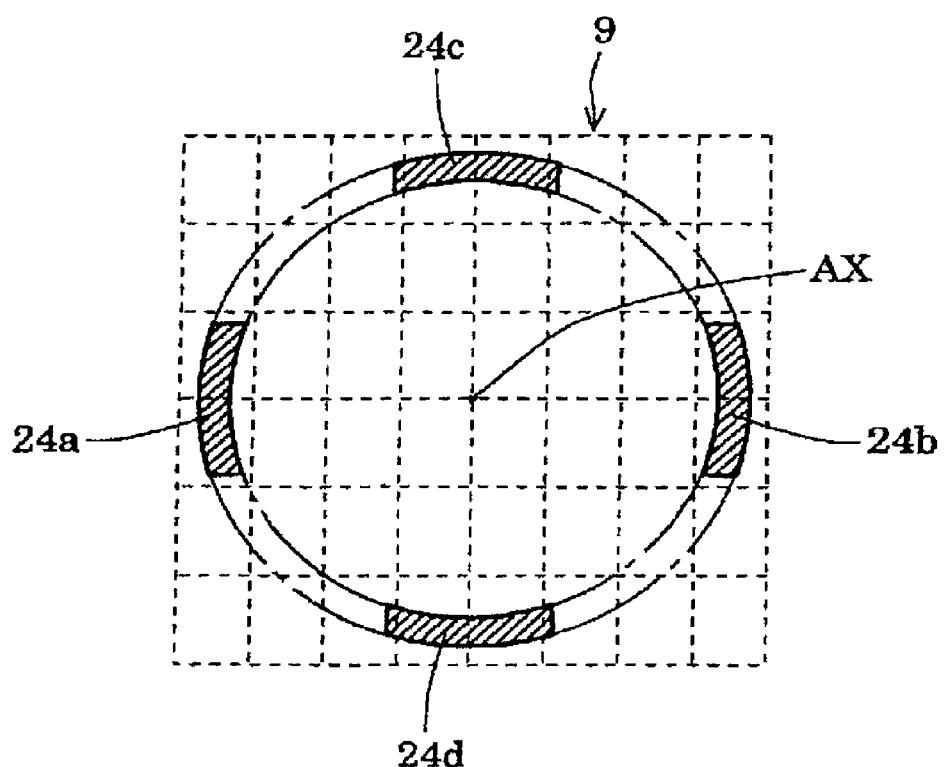
FIG. 12 is a drawing schematically showing a secondary light source of a cross-shaped quadrupole shape formed with the micro fly's eye lens for quadrupole illumination in the fourth modification example.
Figure 13:
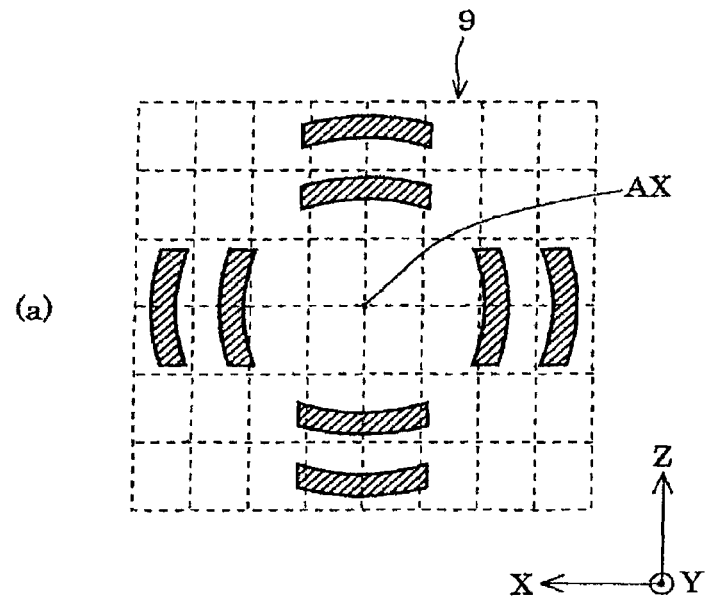
FIG. 13 is a drawing schematically showing a secondary light source of a cross-shaped double quadrupole shape and a secondary light source of an X-shaped double quadrupole shape.
Figure 13:
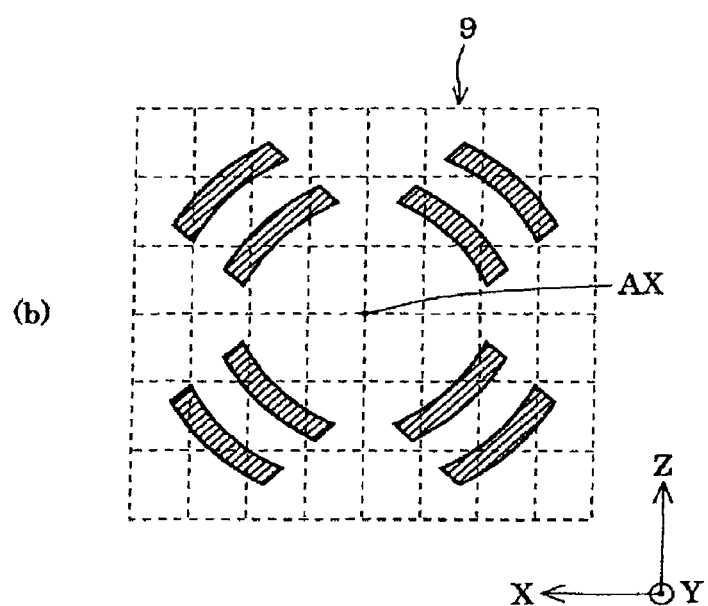

In this manner, the secondary light source is formed in a cross-shaped quadrupole shape consisting of a pair of arcuate surface illuminants 24a and 24b arranged in the X-direction and in symmetry with respect to the optical axis AX and a pair of arcuate surface illuminants 24c and 24d arranged in the Z-direction and in symmetry with respect to the optical axis AX, as shown in FIG. 12, by action of the micro fly's eye lens 44 in the fourth modification example. For approximately matching light intensities on the respective surface illuminants 24a-24d with each other, it is preferable to make the number of first refracting surface regions 44a, the number of second refracting surface regions 44b, the number of third refracting surface regions 44c, and the number of fourth refracting surface regions 44d approximately equal to each other.

In the fourth modification example, for example, a mask pattern with the pitch direction along a direction optically corresponding to the X-direction on the illumination pupil and a mask pattern with the pitch direction along a direction optically corresponding to the Z-direction on the illumination pupil can be illuminated with beams of a high NA corresponding to the maximum numerical aperture (NA) of the illumination optical apparatus, so that pattern images can be formed with high contrast on the wafer W.

It is also possible to apply other appropriate arcuate contours as shown in the first modification example to the third modification example, to the micro fly's eye lens 44 for quadrupole illumination in the fourth modification example. Namely, various modification examples can be contemplated as to the contours, numbers, arrangement, etc. of the respective refracting surface regions in the fourth modification example and various modification examples can also be contemplated as to the surface shape of each deflecting surface region and others.

Specifically, in the fourth modification example each deflecting surface region 44f-44i has a planar shape defined by a normal of one kind. Namely, the large number of first deflecting surface regions 44f have their respective planar shapes parallel to each other; the large number of second deflecting surface regions 44g have their respective planar shapes parallel to each other; the large number of third deflecting surface regions 44h have their respective planar shapes parallel to each other; the large number of fourth deflecting surface regions 44i have their respective planar shapes parallel to each other. However, without having to be limited to this, a secondary light source of a cross-shaped double quadrupole shape as shown in FIG. 13(a), i.e., a secondary light source of an octupole shape can be formed, for example, based on a configuration in which each deflecting surface region has a shape of planes defined by normals of two kinds.

For forming a secondary light source of an X-shaped double quadrupole shape as shown in FIG. 13(b), it is necessary to define a shape of planes of each deflecting surface region by normals of two kinds and to rotate the arrangement of the large number of refracting surface regions and deflecting surface regions by 45° around the Y-axis, in the micro fly's eye lens 44 for quadrupole illumination in the fourth modification example. In the embodiment of FIGS. 3 to 5 and the first modification example to the third modification example, the planar shape of each deflecting surface region can be defined by normals of two kinds, when necessary, to form a secondary light source of a double dipole shape (not shown).

Figure 14:
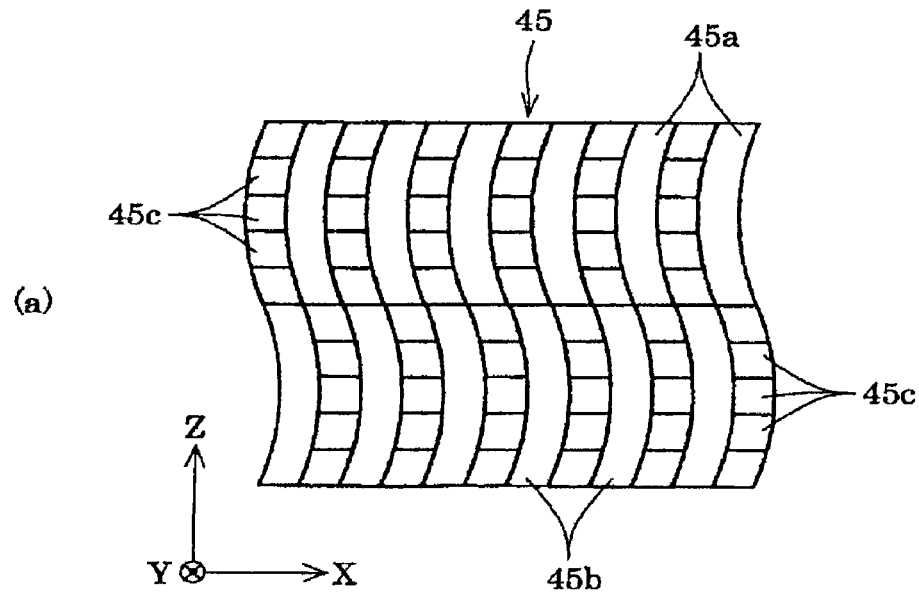
FIG. 14 is a drawing schematically showing a configuration of a micro fly's eye lens for tripole illumination in a fifth modification example, wherein (a) is a view from the light source side and (b) a view from the mask side.
Figure 14:
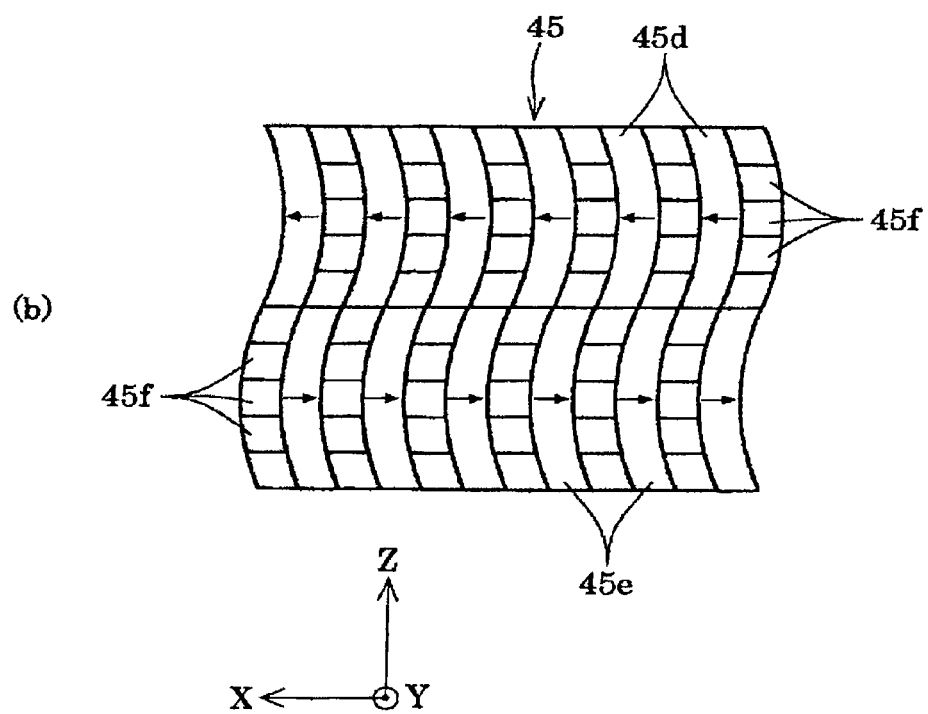
Figure 15:
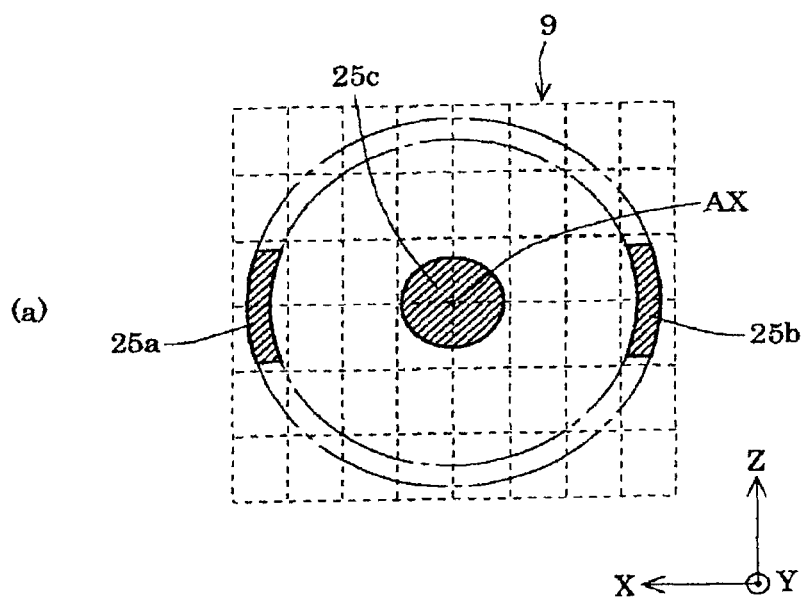
FIG. 15 is a drawing schematically showing a secondary light source of a tripole shape formed with the micro fly's eye lens for tripole illumination in the fifth modification example and a configuration of an aperture stop for defining a center pole.
Figure 15:
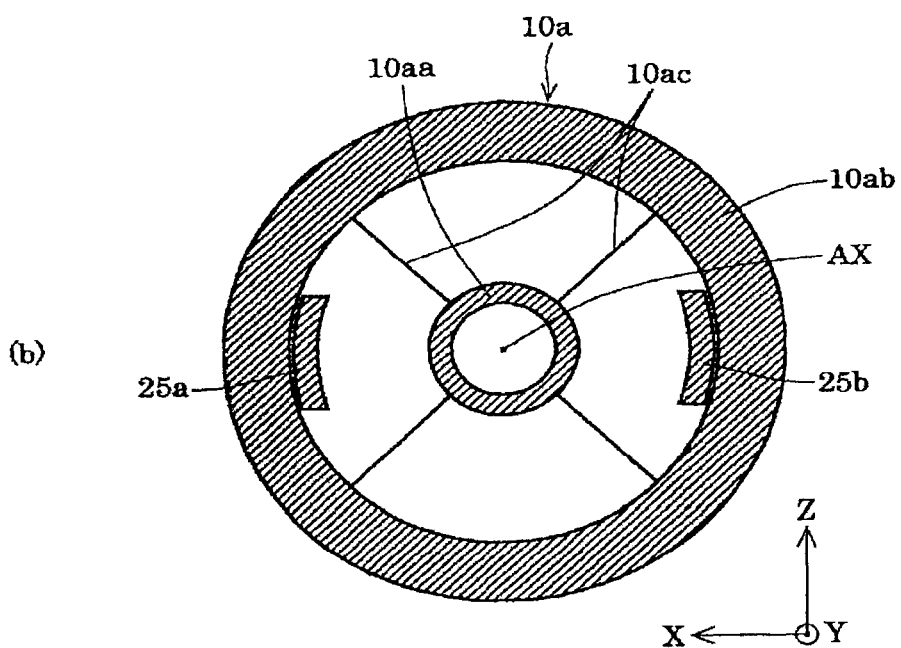

Furthermore, a micro fly's eye lens for tripole illumination can be realized based on a configuration similar to that in the embodiment of FIGS. 3 to 5. The micro fly's eye lens for tripole illumination according to the fifth modification example will be described below with reference to FIGS. 14 and 15. With reference to FIG. 14(a), the following refracting surface regions are formed on the entrance side (light source side) of the micro fly's eye lens 45 for tripole illumination according to the fifth modification example: a large number of first refracting surface regions 45a of an arcuate shape with the center projecting in the −X-direction; a large number of second refracting surface regions 45b of an arcuate shape with the center projecting in the +X-direction. A large number of third refracting surface regions 45c are formed between two adjacent first refracting surface regions 45a and between two adjacent second refracting surface regions 45b.

The first refracting surface regions 45a and the second refracting surface regions 45b have respective configurations corresponding to those of the first refracting surface regions 4a and the second refracting surface regions 4b in the micro fly's eye lens 4 for dipole illumination shown in FIGS. 3 to 5. On the other hand, the third refracting surface regions 45c have a contour of a nearly rectangular shape (or an arcuate shape close to a square) obtained by dividing each arcuate region corresponding to the first refracting surface regions 45a and the second refracting surface regions 45b in the Z-direction (FIG. 14 shows an example of division into five equal parts). The third refracting surface regions 45c have a convex shape (or concave shape) as the first refracting surface regions 45a and the second refracting surface regions 45b, and have a function to refract incident light.

In general, it is possible to apply various surface shapes, for example, including a part of a spherical surface, a part of a rotationally symmetric aspherical surface, and a part of a rotationally asymmetric aspherical surface (e.g., a toric surface) to the surface shape of each third refracting surface region 45c, as in the case of the first refracting surface regions 45a and the second refracting surface regions 45b. For simpler description, it is assumed in the fifth modification example that each third refracting surface region 45c has a spherical convex shape symmetric with respect to each center axis parallel to the optical axis AX, for example.

On the other hand, the following deflecting surface regions are formed on the exit side (mask side) of the micro fly's eye lens 45 for tripole illumination, as shown in FIG. 14(b): a large number of arcuate first deflecting surface regions 45d arranged along the X-direction corresponding to the large number of first refracting surface regions 45a; a large number of arcuate second deflecting surface regions 45e arranged along the X-direction corresponding to the large number of second refracting surface regions 45b; a large number of nearly rectangular third deflecting surface regions 45f arranged corresponding to the large number of third refracting surface regions 45c.

The first deflecting surface regions 45d have a planar shape with an up slope relative to the +X-direction as the first deflecting surface regions 4c in the micro fly's eye lens 4 for dipole illumination, and the second deflecting surface regions 45e have a planar shape with an up slope relative to the −X-direction as the second deflecting surface regions 4d. On the other hand, the third deflecting surface regions 45f have a planar shape perpendicular to the optical axis AX (and, therefore, perpendicular to the Y-axis) and have a function to transmit rays incident through the corresponding third refracting surface regions 45c and in parallel with the optical axis AX, without change in their traveling direction.

Accordingly, nearly parallel beams guided through the respective third refracting surface regions 45c to the respective corresponding third deflecting surface regions 45f are not substantially subjected to deflection in the respective third deflecting surface regions 45f, to form a light intensity distribution of a nearly circular shape centered on the optical axis AX on the illumination pupil plane, in a superimposed manner. In this way, a secondary light source of a tripole shape is formed as one consisting of a pair of arcuate surface illuminants 25a and 25b arranged in the X-direction and in symmetry with respect to the optical axis AX, and a surface illuminant 25c of a nearly circular shape centered on the optical axis AX, as shown in FIG. 15(a), by action of the micro fly's eye lens 45 in the fifth modification example.

For obtaining an accurate light intensity distribution of a circular shape centered on the optical axis AX on the illumination pupil plane, it is preferable to limit light reaching the surface illuminant 25c of the center pole or light from the surface illuminant 25c, by a circular aperture (light transmitting portion) of an aperture member 10aa for the center pole in an aperture stop 10a shown in FIG. 15(b). The aperture stop 10a is provided with an outside aperture member 10ab having a circular aperture defined by a circle circumscribed to the pair of arcuate surface illuminants 25a and 25b. The aperture member 10aa for the center pole is held by four chord members 10ac extending radially from the outside aperture member 10ab to the inside.

Figure 16:
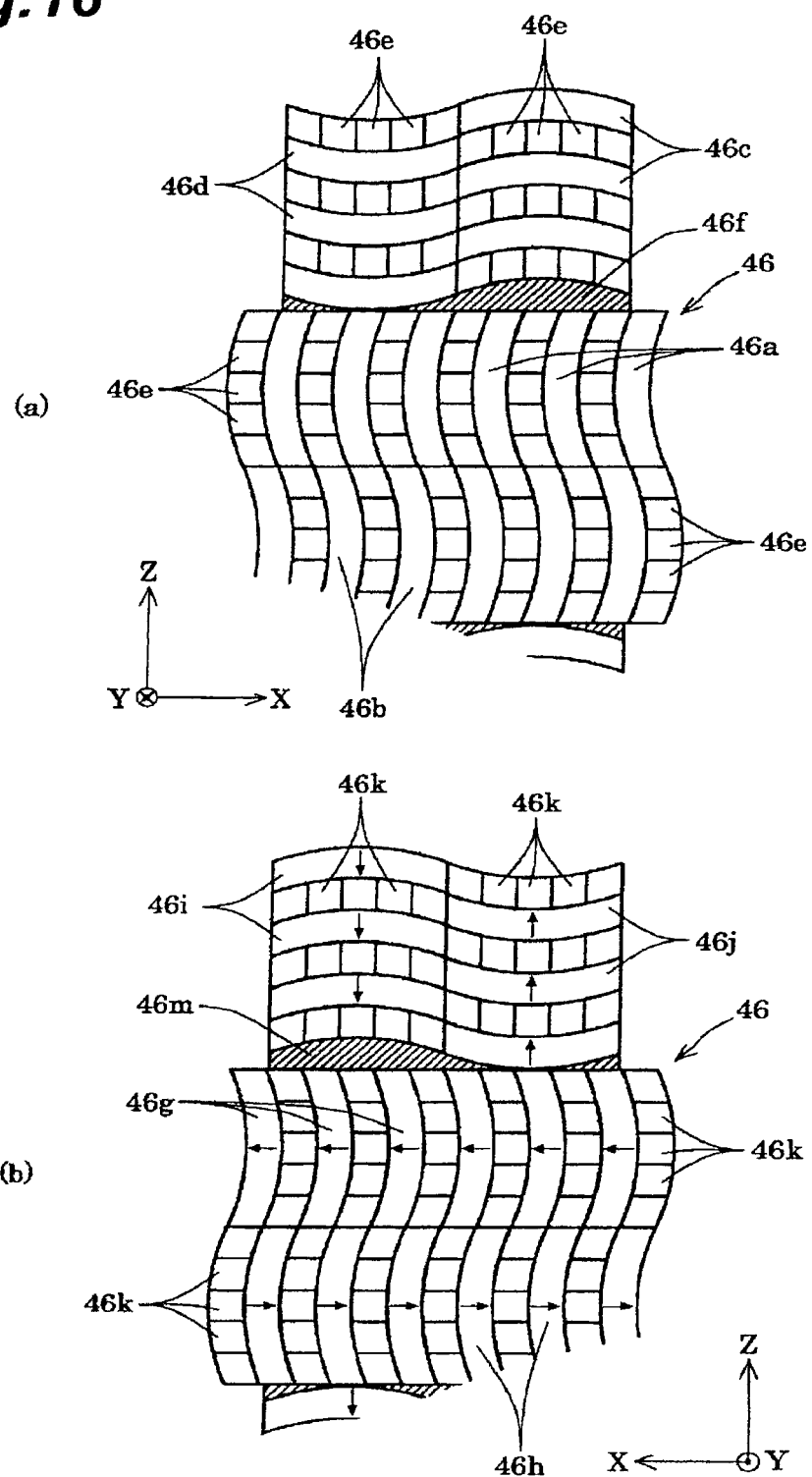
FIG. 16 is a drawing schematically showing a configuration of a micro fly's eye lens for pentapole illumination in a sixth modification example, wherein (a) is a view from the light source side and (b) a view from the mask side.

Similarly, a micro fly's eye lens for pentapole illumination can be realized based on a configuration similar to that in the fourth modification example of FIGS. 9 to 12. The micro fly's eye lens for pentapole illumination according to the sixth modification example will be described below with reference to FIGS. 16 and 17. With reference to FIG. 16(a), the following refracting surface regions are formed on the entrance side (light source side) of the micro fly's eye lens 46 for pentapole illumination in the sixth modification example: a large number of first refracting surface regions 46a of an arcuate shape with the center projecting in the −X-direction; a large number of second refracting surface regions 46b of an arcuate shape with the center projecting in the +X-direction; a large number of third refracting surface regions 46c of an arcuate shape with the center projecting in the +Z-direction; a large number of fourth refracting surface regions 46d of an arcuate shape with the center projecting in the −Z-direction. Furthermore, a large number of fifth refracting surface regions 46e are formed between two adjacent first refracting surface regions 46a, between two adjacent second refracting surface regions 46b, between two adjacent third refracting surface regions 46c, and between two adjacent fourth refracting surface regions 46d.

The first refracting surface regions 46a to the fourth refracting surface regions 46d have respective configurations corresponding to the first refracting surface regions 44a to the fourth refracting surface regions 44d in the micro fly's eye lens 44 for quadrupole illumination shown in FIGS. 9 to 12. On the other hand, the fifth refracting surface regions 46e have a contour of a nearly rectangular shape (or an arcuate shape close to a square) obtained by dividing an arcuate region corresponding to the first refracting surface regions 46a and the second refracting surface regions 46b in the Z-direction (FIG. 16 shows an example of division into five equal parts), or a contour of a nearly rectangular shape (or an arcuate shape close to a square) obtained by dividing an arcuate region corresponding to the third refracting surface regions 46c and the fourth refracting surface regions 46d in the X-direction (FIG. 16 shows an example of division into five equal parts).

Namely, the fifth refracting surface regions 46e formed between two adjacent first refracting surface regions 46a and between two adjacent second refracting surface regions 46b have a configuration corresponding to that of the third refracting surface regions 45c in the fifth modification example. The fifth refracting surface regions 46e formed between two adjacent third refracting surface regions 46c and between two adjacent fourth refracting surface regions 46d have a configuration obtained by rotating the third refracting surface regions 45c in the fifth modification example by 90° in the drawing. The fifth refracting surface regions 46e have a convex shape (or concave shape) as the third refracting surface regions 45c in the fifth modification example, and have a function to refract incident light. Shield regions 46f are provided between the first and second refracting surface regions 46a, 46b and the third and fourth refracting surface regions 46c, 46d.

On the other hand, the following regions are formed on the exit side (mask side) of the micro fly's eye lens 46 for pentapole illumination, as shown in FIG. 16(b): a large number of arcuate first deflecting surface regions 46g arranged along the X-direction corresponding to the large number of first refracting surface regions 46a; a large number of arcuate second deflecting surface regions 46h arranged along the X-direction corresponding to the large number of second refracting surface regions 46b; a large number of arcuate third deflecting surface regions 46i arranged along the Z-direction corresponding to the large number of third refracting surface regions 46c; a large number of arcuate fourth deflecting surface regions 46j arranged along the Z-direction corresponding to the large number of fourth refracting surface regions 46d; a large number of nearly rectangular fifth deflecting, surface regions 46k arranged corresponding to the large number of fifth refracting surface regions 46e; shield regions 46m arranged corresponding to the shield regions 46f.

The first deflecting surface regions 46g have a planar shape with an up slope relative to the +X-direction as the first deflecting surface regions 44f in the micro fly's eye lens 44 for quadrupole illumination; the second deflecting surface regions 46h have a planar shape with an up slope relative to the −X-direction as the second deflecting surface regions 44g; the third deflecting surface regions 46i have a planar shape with an up slope relative to the −Z-direction as the third deflecting surface regions 44h; the fourth deflecting surface regions 46j have a planar shape with an up slope relative to the +Z-direction as the fourth deflecting surface regions 44i. On the other hand, the fifth deflecting surface regions 46k have a planar shape perpendicular to the optical axis AX (and, therefore, perpendicular to the Y-axis) as the third deflecting surface regions 45f in the micro fly's eye lens 45 for tripole illumination, and have a function to transmit rays incident through the corresponding fifth refracting surface regions 46e and in parallel with the optical axis AX, without change in their traveling direction.

Figure 17:
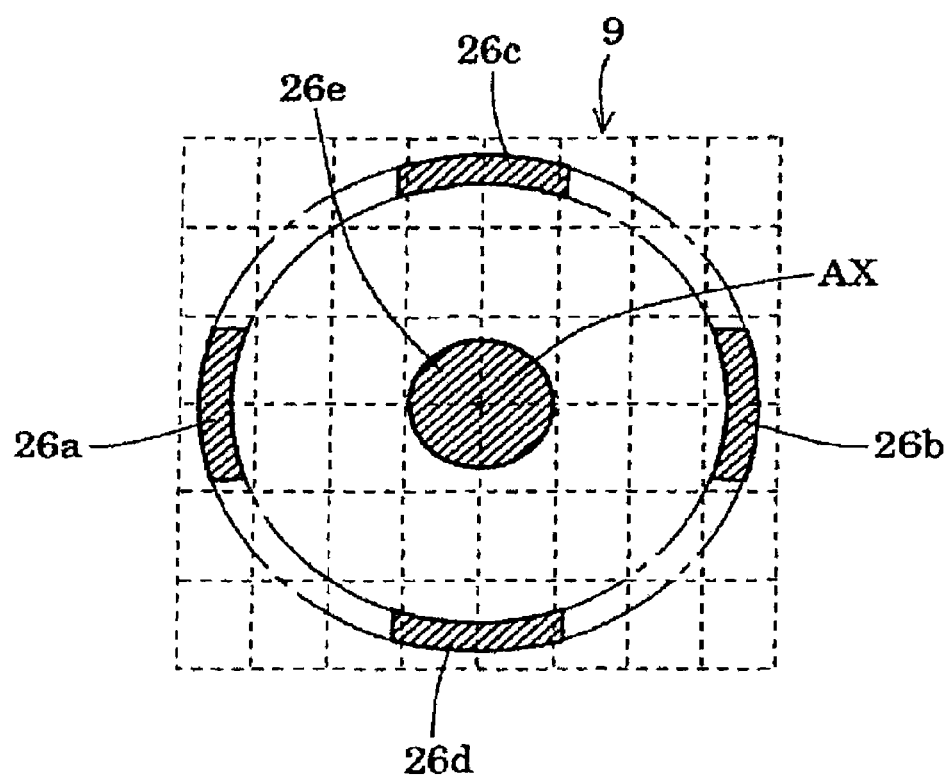
FIG. 17 is a drawing schematically showing a secondary light source of a pentapole shape formed with the micro fly's eye lens for pentapole illumination in the sixth modification example.

Accordingly, nearly parallel beams guided through the respective fifth refracting surface regions 46e to the respective corresponding fifth deflecting surface regions 46k are not substantially subjected to deflection in the respective fifth deflecting surface regions 46k, to form a light intensity distribution of a nearly circular shape centered on the optical axis AX on the illumination pupil plane, in a superimposed manner. In this manner, a secondary light source of a pentapole shape is formed as one consisting of a pair of arcuate surface illuminants 26a and 26b arranged in the X-direction and in symmetry with respect to the optical axis AX, a pair of arcuate surface illuminants 26c and 26d arranged in the Z-direction and in symmetry with respect to the optical axis AX, and a surface illuminant 26e of a nearly circular shape centered on the optical axis AX, as shown in FIG. 17, by action of the micro fly's eye lens 46 in the sixth modification example. In the sixth modification example, for obtaining an accurate light intensity distribution of a circular shape centered on the optical axis AX on the illumination pupil plane, it is also preferable to limit light reaching the surface illuminant 26e of the center pole or light from the surface illuminant 26e, by the circular aperture of the center-pole aperture member 10aa of the aperture stop 10a shown in FIG. 15(b).

It is also possible to apply other appropriate arcuate contours as shown in the first modification example to the third modification example, to the micro fly's eye lens 45 for tripole illumination in the fifth modification example and the micro fly's eye lens 46 for pentapole illumination in the sixth modification example. Namely, in the fifth modification example, various modification examples can be contemplated as to the contours, numbers, arrangement, etc. of the respective refracting surface regions except for the third refracting surface regions 45c. In the sixth modification example, various modification examples can be contemplated as to the contours, numbers, arrangement, etc. of the respective refracting surface regions except for the fifth refracting surface regions 46e.

In the fifth modification example and the sixth modification example, the third refracting surface regions 45c and the fifth refracting surface regions 46e for illuminating the surface illuminant of the center pole in the superimposed manner have the nearly rectangular contour resulting from division of the arcuate region adjacent to other refracting surface regions. However, without having to be limited to this, various modification examples can be contemplated as to the contour, number, arrangement, etc. of the center-pole refracting surface regions for forming the surface illuminant of the center pole in the superimposed manner. As an example, FIG. 18 shows a configuration example in which the refracting surface regions for the center pole are set in a circular contour.

Figure 18:
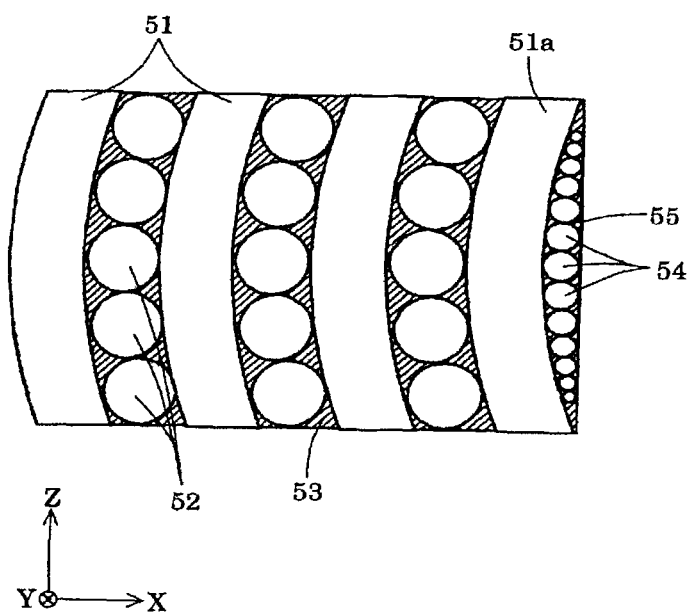
FIG. 18 is a drawing to illustrate another technique for forming a circular surface illuminant of a center pole in the tripole illumination or the pentapole illumination.

In the configuration example of FIG. 18, a large number of circular refracting surface regions 52 for the center pole are formed between two adjacent refracting surface regions 51, on the entrance side (light source side) of the micro fly's eye lens. The refracting surface regions 51 correspond to the first refracting surface regions 45a or the second refracting surface regions 45b in the fifth modification example. Alternatively, the refracting surface regions 51 correspond to the first refracting surface regions 46a, the second refracting surface regions 46b, the third refracting surface regions 46c, or the fourth refracting surface regions 46d in the sixth modification example. On the other hand, the refracting surface regions 52 for the center pole are formed in juxtaposition so as to be adjacent to each other in the arcuate regions corresponding to the refracting surface regions 51. Hatching is given to regions except for the center-pole refracting surface regions 52 in the arcuate regions between two adjacent refracting surface regions 51, and the hatched regions 53 are shield regions.

The refracting surface regions 52 for the center pole have a convex shape (or concave shape) as the third refracting surface regions 45c in the fifth modification example and the fifth refracting surface regions 46e in the sixth modification example, and have a function to refract incident light. Specifically, the refracting surface regions 52 for the center pole have, for example, a spherical convex shape symmetric with respect to each center axis parallel to the optical axis AX. On the exit side (mask side) of the micro fly's eye lens, though not shown, a large number of circular center-pole deflecting surface regions are provided corresponding to the large number of center-pole refracting surface regions 52 and shield regions are provided corresponding to the shield regions 53.

The deflecting surface regions for the center pole have a planar shape perpendicular to the optical axis AX (and, therefore, perpendicular to the Y-axis) as the third deflecting surface regions 45f in the fifth modification example and the fifth deflecting surface regions 46k in the sixth modification example, and have a function to transmit rays incident through the corresponding refracting surface regions 52 for the center pole and in parallel with the optical axis AX, without change in their traveling direction. Accordingly, nearly parallel beams guided through the respective center-pole refracting surface regions 52 to the respective corresponding center-pole deflecting surface regions are not substantially subjected to deflection in the respective center-pole deflecting surface regions, to form an accurate light intensity distribution of a circular shape centered on the optical axis AX on the illumination pupil plane, in a superimposed manner. In this case, therefore, there is no need for limiting the beams by the circular aperture of the center-pole aperture member 10a of the aperture stop 10a shown in FIG. 15(b).

It is also possible to adopt a configuration example wherein, instead of the center-pole refracting surface regions 52 or in addition to the center-pole refracting surface regions 52, a plurality of circular center-pole refracting surface regions 54 with various sizes are formed in a crescent region in contact with a refracting surface region 51a located at an end and the rest region is formed as a shield region 55. In this case, a plurality of circular center-pole deflecting surface regions with various sizes are also provided corresponding to the plurality of center-pole refracting surface regions 54 and a shield region is provided corresponding to the shield region 55, on the exit side (mask side) of the micro fly's eye lens.

The refracting surface regions 54 for the center pole have a spherical convex shape symmetric with respect to each center axis parallel to the optical axis AX and the deflecting surface regions for the center pole have a planar shape perpendicular to the optical axis AX (and, therefore, perpendicular to the Y-axis). However, each center-pole refracting surface region 54 is provided with a refracting power according to the size of the contour thereof so that beams having passed through the respective center-pole refracting surface regions 54 are superimposed in a circular region centered on the optical axis AX on the illumination pupil plane. In this case, therefore, there is no need for limiting the beams by the circular aperture of the center-pole aperture member 10aa of the aperture stop 10a shown in FIG. 15(b), either.

Each of the above-described embodiment and modification examples uses the micro fly's eye lens in which the refracting surface regions are formed on the entrance side and in which the deflecting surface regions are formed on the exit side, but it is also possible to realize a micro fly's eye lens in which the deflecting surface regions are formed on the entrance side and in which the refracting surface regions are formed on the exit side.

In each of the above-described embodiment and modification examples the deflecting surface regions are formed in the planar shape with no refracting power, but, without having to be limited to this, it is also possible to form the deflecting surface regions in a curved surface shape with a substantial refracting power, e.g., a curved surface shape corresponding to a spherical surface or aspherical surface of a convex shape, or a spherical surface or an aspherical surface of a concave shape. This configuration permits the deflecting surface regions to share the refracting action of the refracting surface regions.

When the micro fly's eye lens (4; 41-46) is made by physical processing, the light intensity distribution of the secondary light source might not be a desired light intensity distribution because of a processing error. In this case, for example, a correction filter may be located on the illumination pupil plane. Such a correction filter located on the illumination pupil plane is disclosed, for example, in Japanese Patent Application Laid-open No. 2004-247527. The teaching of Japanese Patent Application Laid-open No. 2004-247527 is incorporated herein by reference.

In the above description, the micro fly's eye lens (4; 41-46) in each of the above embodiment and modification examples is made of fluorite in order to ensure sufficient durability to light in the ultraviolet region of short wavelengths, but, without having to be limited to this, the micro fly's eye lens can also be made of another fluoride crystal material, e.g., barium fluoride, lithium fluoride, magnesium fluoride, sodium fluoride, or strontium fluoride.

The micro fly's eye lens (4; 41-46) in each of the above-described embodiment and modification examples can also be made of an oxide crystal material, e.g., rock crystal ($SiO_2$), barium titanate ($BaTiO_3$), titanium trioxide ($TiO_3$), magnesium oxide (MgO), or sapphire ($Al_2O_3$). Furthermore, the micro fly's eye lens (4; 41-46) in each of the above-described embodiment and modification examples can also be made of an optically transparent amorphous material such as silica glass.

The micro fly's eye lens (4; 41-46) in each of the above-described embodiment and modification examples can also be made, for example, of an optical material with optical activity (rotatory polarization characteristic) or an optical material with retardation. This enables the following polarization setting: for example, while forming a secondary light source localized in an annular region, a beam passing through the secondary light source is set in a linearly polarized state with a direction of polarization along its circumferential direction (hereinafter referred to as a "circumferential polarization state").

Figure 19:
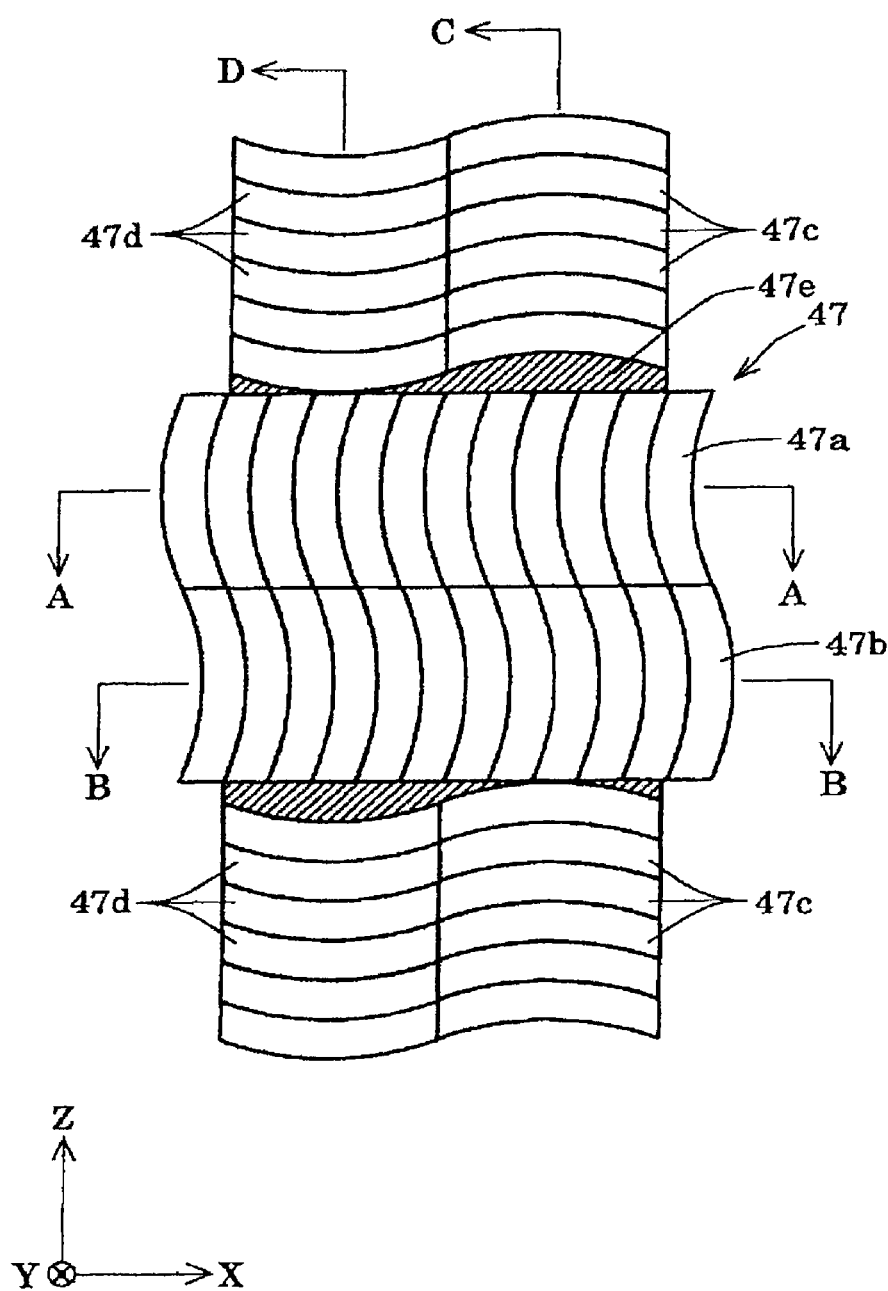
FIG. 19 is a view from the light source side of a micro fly's eye lens for quadrupole illumination with a circumferential polarization state in a seventh modification example.

A micro fly's eye lens for quadrupole illumination with the circumferential polarization state in the seventh modification example will be described below with reference to FIGS. 19 to 22. With reference to FIG. 19, the following refracting surface regions are formed on the entrance side (light source side) of the micro fly's eye lens 47 for quadrupole illumination with the circumferential polarization state according to the seventh modification example: a large number of first refracting surface regions 47a of an arcuate shape with the center projecting in the −X-direction; a large number of second refracting surface regions 47b of an arcuate shape with the center projecting in the +X-direction; a large number of third refracting surface regions 47c of an arcuate shape with the center projecting in the +Z-direction; a large number of fourth refracting surface regions 47d of an arcuate shape with the center projecting in the −Z-direction.

The first to fourth refracting surface regions 47a-47d have respective configurations corresponding to the first to fourth refracting surface regions 44a-44d in the micro fly's eye lens 44 for quadrupole illumination shown in FIGS. 9 to 12. Regions 47e hatched in the drawing are shield regions between the first and second refracting surface regions 47a, 47b and the third and fourth refracting surface regions 47c, 47d.

Figure 20:
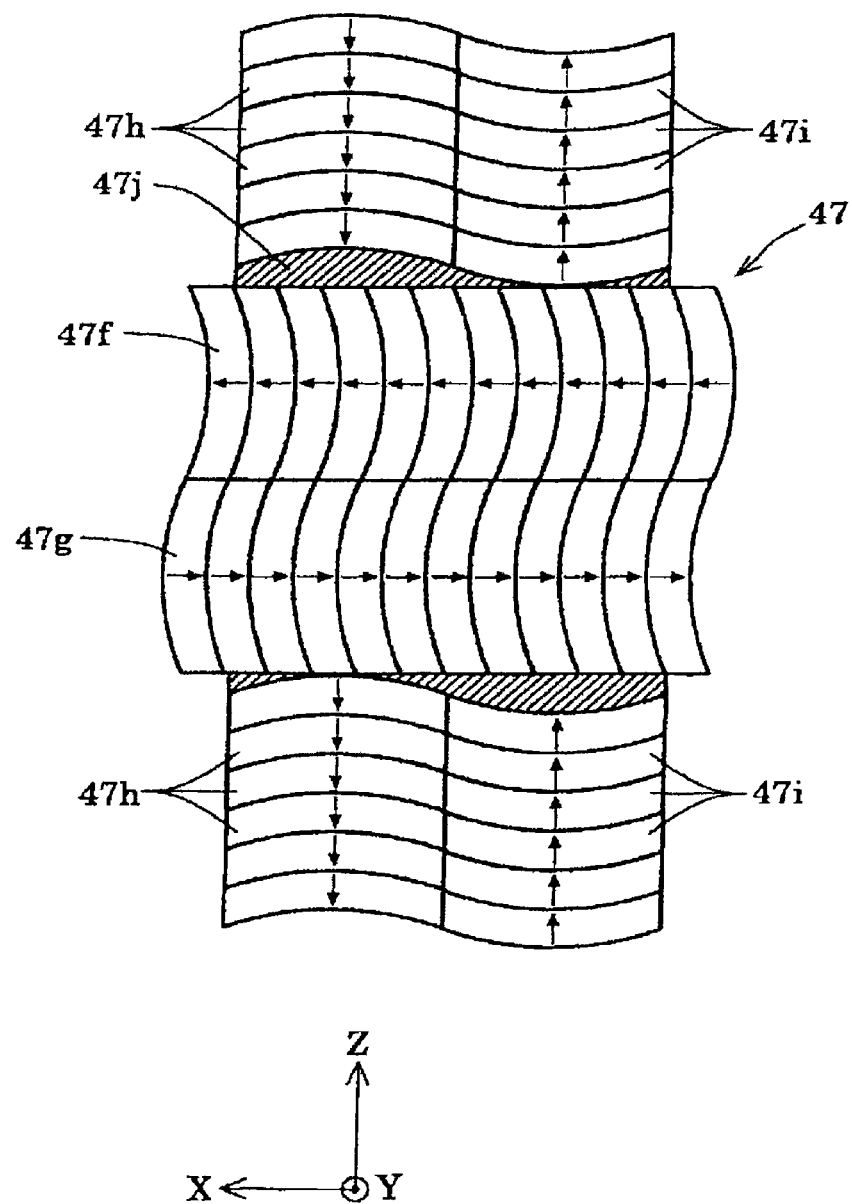
FIG. 20 is a view from the mask side of the micro fly's eye lens for quadrupole illumination with the circumferential polarization state in the seventh modification example.

On the other hand, the following deflecting surface regions are formed on the exit side (mask side) of the micro fly's eye lens 47 for quadrupole illumination with the circumferential polarization state, as shown in FIG. 20: a large number of arcuate first deflecting surface regions 47f densely arranged along the X-direction corresponding to the large number of first refracting surface regions 47a; a large number of arcuate second deflecting surface regions 47g densely arranged along the X-direction corresponding to the large number of second refracting surface regions 47b; a large number of arcuate third deflecting surface regions 47h densely arranged along the Z-direction corresponding to the large number of third refracting surface regions 47c; a large number of arcuate fourth deflecting surface regions 47i densely arranged along the Z-direction corresponding to the large number of fourth refracting surface regions 47d. Regions 47j hatched in the drawing are shield regions between the first and second deflecting surface regions 47f, 47g and the third and fourth deflecting surface regions 47h, 47i. The exit-side shield regions 47j are provided corresponding to the entrance-side shield regions 47e.

The first to fourth deflecting surface regions 47f-47i have respective configurations corresponding to the first to fourth deflecting surface regions 44f-44i in the micro fly's eye lens 44 for quadrupole illumination shown in FIGS. 9 to 12. The micro fly's eye lens 47 in the seventh modification example is made of an optical material with optical activity, e.g., rock crystal ($SiO_2$). In this case, the crystal optic axis of rock crystal is approximately matched with the optical-axis direction (the Y-axis direction in the drawing).

Figure 21:
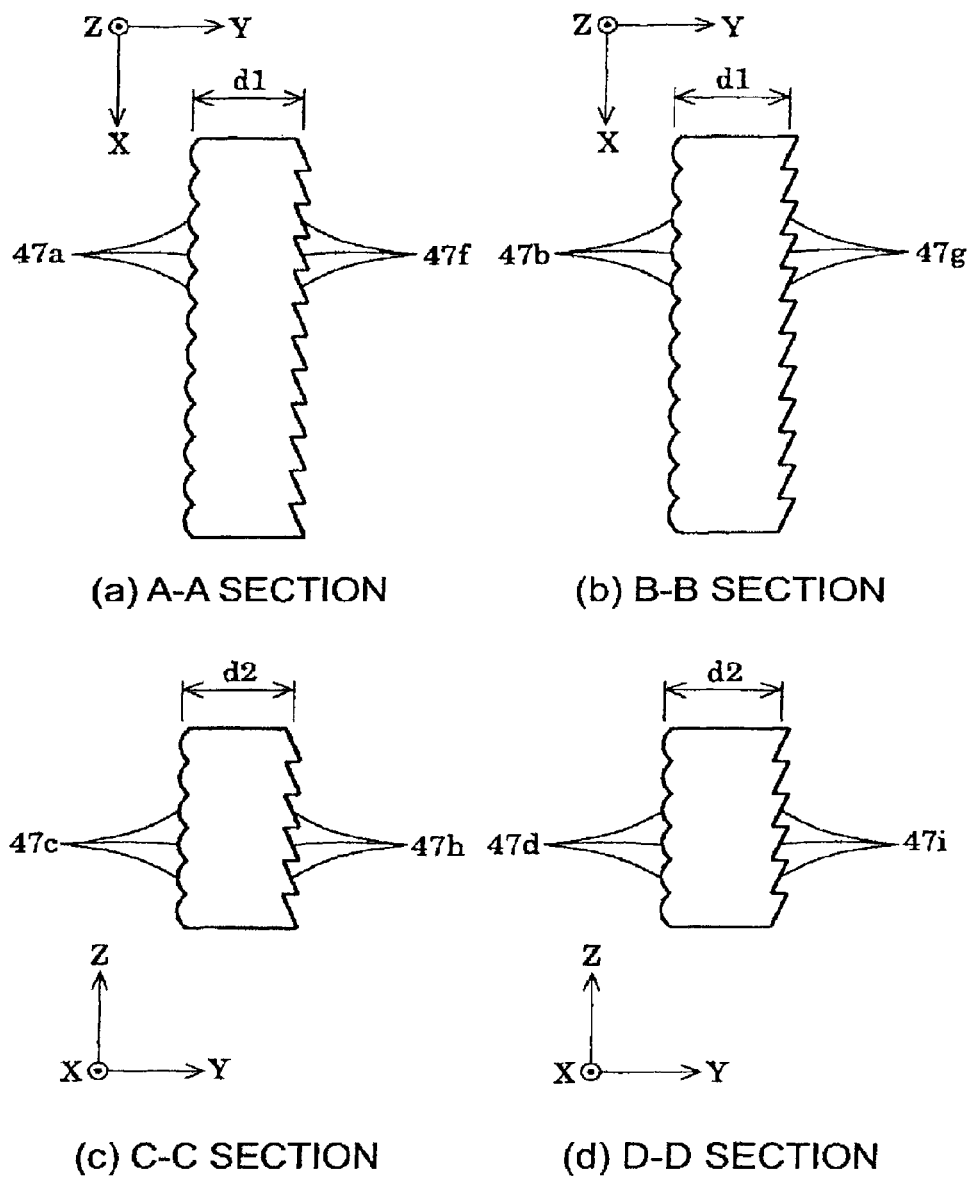
FIG. 21 is a sectional view of the micro fly's eye lens for quadrupole illumination with the circumferential polarization state in the seventh modification example.

In the micro fly's eye lens 47 of the seventh modification example, as shown in FIG. 21, the thickness d1 in the optical-axis direction (Y-axis direction) of the regions corresponding to the first and second refracting surface regions 47a, 47b (first and second deflecting surface regions 47f, 47g) and the thickness d2 in the optical-axis direction of the regions corresponding to the third and fourth refracting surface regions 47c, 47d (third and fourth deflecting surface regions 47h, 47i) are set so as to satisfy $d1\cdot\rho=\theta 1$ and $d2\cdot\rho=\theta 2$.

It is, however, provided that $\rho$ represents the optical activity of the optical material (rock crystal), $\theta 1$ a rotation angle of the polarization direction of linearly polarized light having passed through the first and second refracting surface regions 47a, 47b (first and second deflecting surface regions 47f, 47g), and $\theta 2$ a rotation angle of the polarization direction of linearly polarized light having passed through the third and fourth refracting surface regions 47c, 47d (third and fourth deflecting surface regions 47h, 47i); and a relative difference between the rotation angles $\theta 1$ and $\theta 2$ is 90°.

Figure 22:
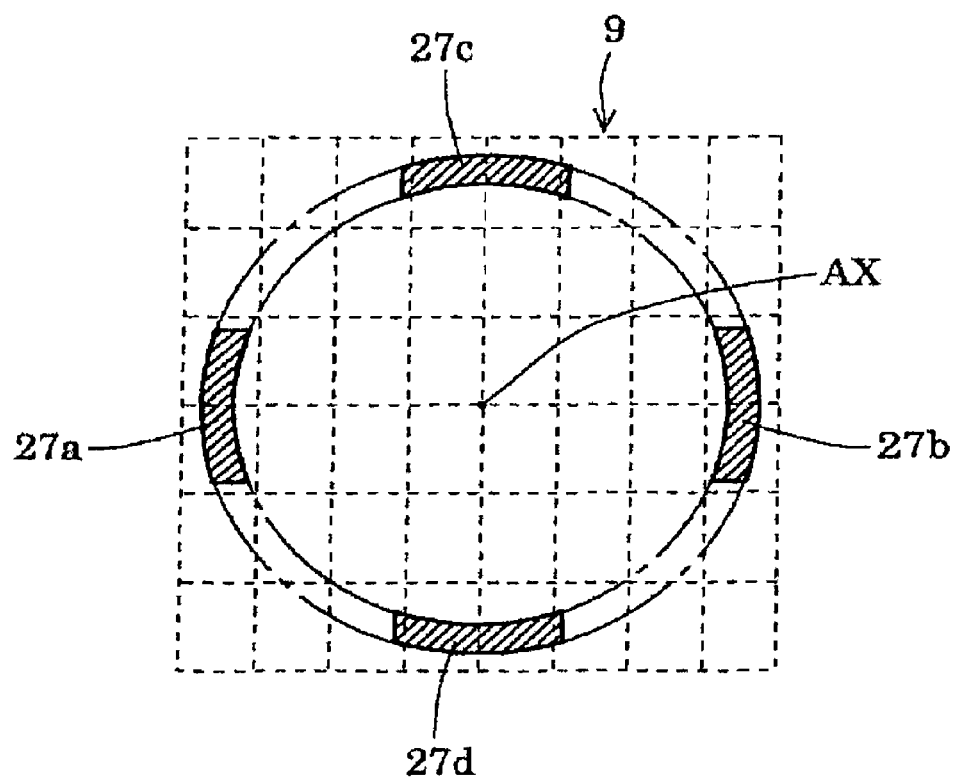
FIG. 22 is a drawing schematically showing a secondary light source of a cross-shaped quadrupole shape formed with the micro fly's eye lens for quadrupole illumination with the circumferential polarization state in the seventh modification example.

When linearly polarized light with the polarization direction along the Z-direction is made incident into the micro fly's eye lens 47 of the seventh modification example, as shown in FIG. 22, the polarization directions in a pair of arcuate surface illuminants 27a and 27b formed by light having passed through the first and second refracting surface regions 47a, 47b (first and second deflecting surface regions 47f, 47g) can be set in the Z-direction in the drawing and the polarization directions in a pair of arcuate surface illuminants 27c and 27d formed by light having passed through the third and fourth refracting surface regions 47c, 47d (third and fourth deflecting surface regions 47h, 47i) can be set in the X-direction in the drawing. Namely, the secondary light source 27a-27d localized in the annular region can be formed in the circumferential polarization state and, therefore, quadrupole illumination can be implemented in a polarization state of s-polarization for the wafer W.

The micro fly's eye lens 47 of the seventh modification example can also be made of an optical material with retardation. In this case, the micro fly's eye lens can be set so that a difference between an optical path length corresponding to the first and second refracting surface regions 47a, 47b (first and second deflecting surface regions 47f, 47g) and an optical path length corresponding to the third and fourth refracting surface regions 47c, 47d (third and fourth deflecting surface regions 47h, 47i) is a half wavelength.

In the seventh modification example the secondary light source is formed in the quadrupole shape with the circumferential polarization state, but it is also possible to form a secondary light source of a cross-shaped double quadrupole shape, a secondary light source of an X-shaped double quadrupole shape, a secondary light source of a tripole shape, or a secondary light source of a pentapole shape, as in the aforementioned modification examples. Furthermore, the shape of each pole is not limited to the arcuate shape, but it is also possible to apply other appropriate arcuate contours. Namely, in the seventh modification example various modification examples can be contemplated as to the contours, numbers, and arrangement of the respective refracting surface regions, the contours, numbers, and arrangement of the respective deflecting surface regions, and the optical path lengths between the respective refracting surface regions and the respective deflecting surface regions.

The below will describe an embodiment of a method for manufacturing the micro fly's eye lens 4, 41-47 for modified illumination according to each of the aforementioned embodiment and modification examples, with reference to the flowchart of FIG. 23.

Figure 23:
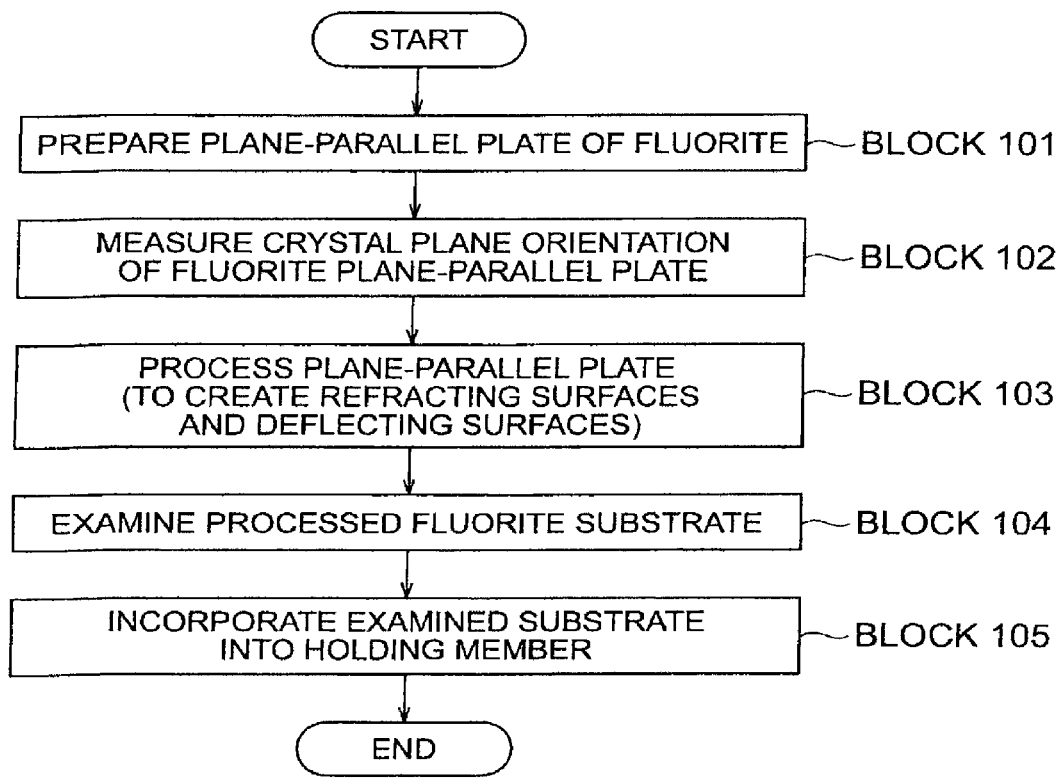
FIG. 23 is a flowchart to illustrate an embodiment of a method for manufacturing the micro fly's eye lens for modified illumination according to each of the embodiment and the modification examples.

The first block 101 in FIG. 23 is to prepare a plane-parallel plate made of a fluoride crystal material, e.g., fluorite as in the above-described embodiment. Where the micro fly's eye lens to be manufactured is the one in the seventh modification example, the plane-parallel plate to be prepared is an optical material with optical activity or an optical material with retardation.

The next block 102 is to measure the crystal plane orientation of the plane-parallel plate of fluorite and to check whether the crystal plane {111} of the plane-parallel plate of fluorite is directed to the optical axis. In this block 102, the measurement can be performed by applying a technique of carrying out, for example, the Laue measurement to directly measure the crystal plane orientation, or a technique of measuring birefringence of the plane-parallel plate of fluorite and determining the crystal axis orientation from the measured birefringence, based on the known relationship between crystal axis orientation and birefringence. When the micro fly's eye lens to be manufactured is the one of the seventh modification example, it is checked whether the crystal optic axis of rock crystal as an optical material with optical activity is directed to the optical axis.

Here the sentence "the crystal plane {111} is directed to the optical axis," or "the crystal optic axis is directed to the optical axis" means that a deviation angle between the optical axis and the crystal axis direction is not more than a predetermined tolerance. The measurement of the crystal plane orientation may be carried out by performing the measurement at only a specific point on the plane-parallel plate of fluorite or by performing the measurement at a plurality of points on the plane-parallel plate of fluorite. When a region with a heretical deviation of the crystal plane orientation is locally present in the plane-parallel plate of fluorite, the deviation of the crystal plane orientation can be permitted as long as it is not more than the tolerance.

The subsequent block 103 is to physically process the plane-parallel plate of fluorite (by micromachining, processing with a die in a high temperature state, or the like) to create a plurality of deflecting surfaces, a plurality of refracting surfaces, or a plurality of refracting and deflecting surfaces on the fluorite substrate or on the rock crystal substrate.

The subsequent block 104 is to examine the fluorite substrate with the plurality of deflecting surfaces, the plurality of refracting surfaces, or the plurality of refracting and deflecting surfaces, i.e., the micro fly's eye lens for modified illumination. In this examination of the micro fly's eye lens, it is checked whether the contour and illuminance distribution of the annular or multi-pole illumination field formed in the far field of the micro fly's eye lens are within a predetermined tolerance. This examination can be performed, for example, by using the technology disclosed in U.S. Patent Publication No. 2006/0166142. The U.S. Patent Publication No. 2006/0166142 is incorporated herein by reference.

When they are off the predetermined tolerance, the micro fly's eye lens will be used in combination with a correction filter disposed on the illumination pupil plane as described above; therefore, it is preferable to calculate a density distribution of the correction filter for correcting the contour and illuminance distribution of the annular or multi-pole illumination field to the predetermined tolerance. It is preferable to provide the examined micro fly's eye lens with information about this density distribution of the correction filter. A method for providing the micro fly's eye lens for modified illumination with the information about the density distribution of the correction filter can be selected from such techniques as a technique of impressing the information in the substrate of the micro fly's eye lens for modified illumination, a technique of attaching, for example, an RF tag to a below-described holding member for holding the micro fly's eye lens for modified illumination and storing the information in the RF tag, and a technique of storing the information of the correction filter for every manufacture number of the examined micro fly's eye lens in the form of a correspondence table in a computer for process management in a manufacturing factory of the illumination optical apparatus or exposure apparatus incorporated with the micro fly's eye lens.

The subsequent block 105 is to incorporate the examined micro fly's eye lens into the holding member. According to the aforementioned embodiment, the micro fly's eye lens can be manufactured with light-quantity loss small at the aperture stop 10 in the modified illumination and with sufficient durability to light in the ultraviolet region of short wavelengths.

The exposure apparatus according to the above-described embodiment can manufacture micro devices (semiconductor devices, imaging devices, liquid-crystal display devices, thin-film magnetic heads, etc.) through a process of illuminating a mask (reticle) by the illumination optical apparatus (illumination block) and exposing a photosensitive substrate with a transfer pattern formed in the mask, by the projection optical system (exposure block). An example of a method for obtaining semiconductor devices as micro devices by forming a predetermined circuit pattern in a wafer or the like as a photosensitive substrate by means of the exposure apparatus of the above embodiment will be described below with reference to the flowchart of FIG. 24.

Figure 24:
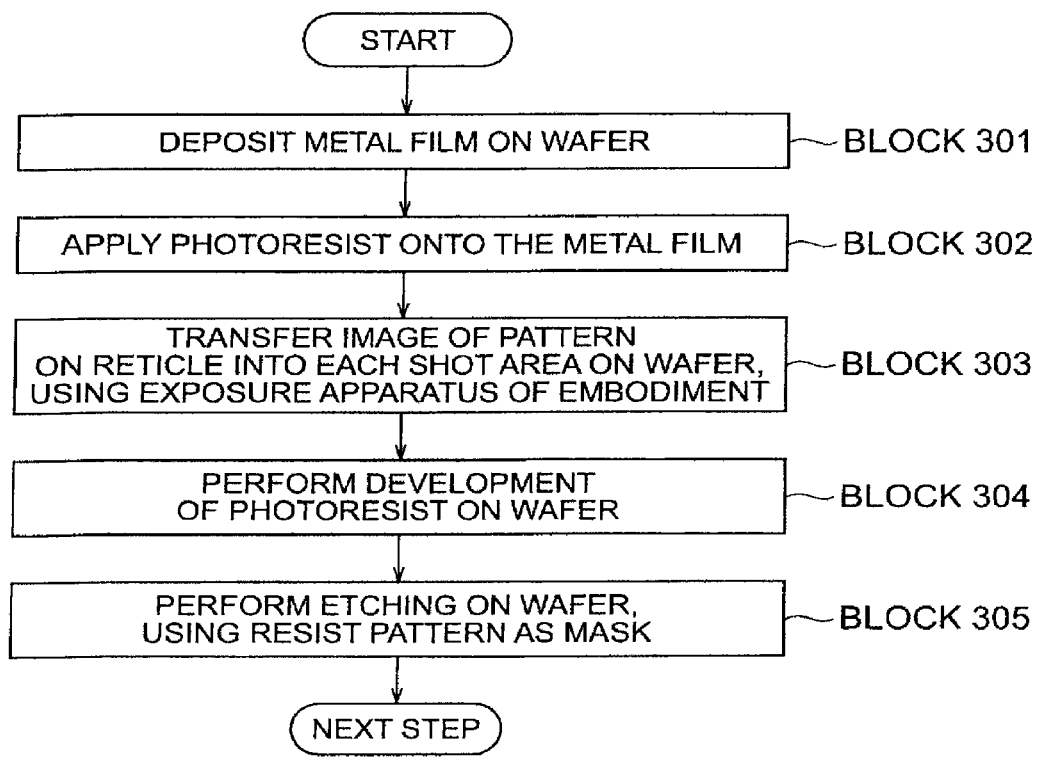
FIG. 24 is a flowchart of a method for obtaining semiconductor devices as micro devices.

The first block 301 in FIG. 24 is to deposit a metal film on each wafer in one lot. The next block 302 is to apply a photoresist onto the metal film on each wafer in the lot. The subsequent block 303 is to use the exposure apparatus of the above embodiment to sequentially transfer an image of a pattern on a mask into each shot area on each wafer in the lot through the projection optical system of the exposure apparatus. The subsequent block 304 is to perform development of the photoresist on each wafer in the lot and the next block 305 is to perform etching using the resist pattern on each wafer in the lot as a mask, and thereby to form a circuit pattern corresponding to the pattern on the mask, in each shot area on each wafer. Thereafter, devices such as semiconductor devices are manufactured through blocks including formation of circuit patterns in upper layers. The above-described semiconductor device manufacturing method permits us to obtain the semiconductor devices with extremely fine circuit patterns at high throughput.

Figure 25:
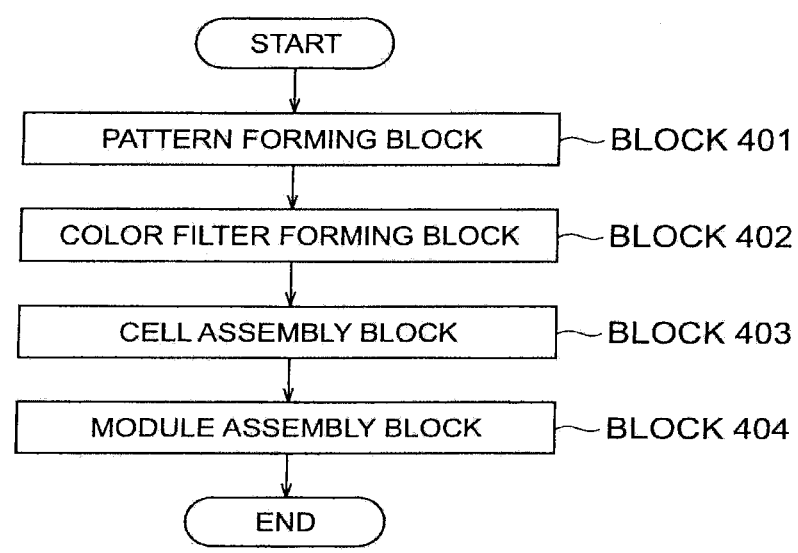
FIG. 25 is a flowchart of a method for obtaining a liquid-crystal display device as a micro device.

The exposure apparatus of the above embodiment can also manufacture a liquid-crystal display device as a micro device by forming predetermined patterns (circuit pattern, electrode pattern, etc.) on plates (glass substrates). An example of a method in this case will be described below with reference to the flowchart of FIG. 25. In FIG. 25, a pattern forming block 401 is to execute the so-called photolithography block of transferring a pattern of a mask onto a photosensitive substrate (a glass substrate coated with a resist or the like) by means of the exposure apparatus of the above embodiment. This photolithography block results in forming a predetermined pattern including a large number of electrodes and others on the photosensitive substrate. Thereafter, the exposed substrate is processed through each of blocks including a development block, an etching block, a resist removing block, etc. whereby the predetermined pattern is formed on the substrate, followed by the next color filter forming block 402.

The next color filter forming block 402 is to form a color filter in which a large number of sets of three dots corresponding to R (Red), G (Green), and B (Blue) are arrayed in a matrix pattern or in which sets of filters of three stripes of R, G and B are arrayed in the horizontal scan line direction. After the color filter forming block 402, a cell assembling block 403 is executed. The cell assembling block 403 is to assemble a liquid crystal panel (liquid crystal cell) using the substrate with the predetermined pattern obtained in the pattern forming block 401, the color filter obtained in the color filter forming block 402, and others.

In the cell assembling block 403, the liquid crystal panel (liquid crystal cell) is manufactured, for example, by pouring a liquid crystal into between the substrate with the predetermined pattern obtained in the pattern forming block 401 and the color filter obtained in the color filter forming block 402. The subsequent module assembling block 404 is to attach various components such as electric circuits and backlights for display operation of the assembled liquid crystal panel (liquid crystal cell) to complete the liquid-crystal display device. The above-described manufacturing method of the liquid-crystal display device permits us to obtain the liquid-crystal display device with extremely fine circuit patterns at high throughput.

The aforementioned embodiment used the ArF excimer laser light (the wavelength: 193 nm) or the KrF excimer laser light (the wavelength: 248 nm) as the exposure light, but the exposure light does not have to be limited to these: the present invention can also be applied to any other appropriate laser light source, e.g., an $F_2$ laser light source for supplying the laser light at the wavelength of 157 nm.

The foregoing embodiment was the application of the present invention to the illumination optical apparatus for illuminating the mask or the wafer in the exposure apparatus, but, without having to be limited to this, the present invention can also be applied to commonly-used illumination optical apparatus for illuminating an illumination target surface except for the mask or the wafer.

For example, when the optical integrator according to the above embodiment is used in multipole illumination with an illumination optical apparatus, a beam guided through each first refracting surface region of the arcuate shape to each corresponding first deflecting surface region and a beam guided through each second refracting surface region of the arcuate shape opposite to each first refracting surface region, to each corresponding second deflecting surface region are subjected to opposite deflection actions of the first deflecting surface region and the second deflecting surface region to form a dipolar secondary light source of a nearly desired shape consisting of two substantial surface illuminants of an arcuate shape corresponding to a part of an annular region. As a result, beams from the secondary light source of the nearly desired shape are guided to an illumination target surface, without any light-quantity loss or with only a small light-quantity loss at the aperture of the aperture stop.

Therefore, the illumination optical apparatus of the above embodiment is able to illuminate the illumination target surface under a desired illumination condition, using the optical integrator capable of keeping down the light-quantity loss in the modified illumination. The exposure apparatus of the above embodiment is able to implement good exposure under a good illumination condition, using the illumination optical apparatus which illuminates a pattern under a desired illumination condition, and, in turn, to manufacture good devices at high throughput.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

The invention claimed is:

1. An optical integrator of a wavefront division type, comprising:
   a plurality of refracting surface regions which refract the incident light,
   wherein the plurality of refracting surface regions comprise a plurality of first refracting surface regions including a contour with a center projecting in a first direction perpendicular to an incident light, and a plurality of second refracting surface regions including a contour with a center projecting in a second direction different from the first direction.

2. The optical integrator according to claim 1, wherein the first direction and the second direction are opposed to each other.

3. The optical integrator according to claim 2, wherein the first refracting surface regions and the second refracting surface regions are continuously formed.

4. The optical integrator according to claim 2, wherein the contour of the plurality of first refracting surface regions and the contour of the plurality of second refracting surface regions are substantially symmetric with respect to a third direction orthogonal to the first direction.

5. The optical integrator according to claim 2, wherein at least either of the plurality of first refracting surface regions and the plurality of second refracting surface regions include the contour curved in an arcuate shape.

6. The optical integrator according to claim 5, wherein the contour curved in the arcuate shape corresponds to a contour of a partial region along a circumferential direction of an annular region.

7. The optical integrator according to claim 2, wherein at least either of the plurality of first refracting surface regions and the plurality of second refracting surface regions include a contour bent in an arcuate shape.

8. The optical integrator according to claim 1, wherein a number of the plurality of first refracting surface regions is substantially equal to a number of the plurality of second refracting surface regions.

9. The optical integrator according to claim 1, wherein the plurality of refracting surface regions comprise a plurality of third refracting surface regions including a contour with a center projecting in a third direction orthogonal to the first direction, and a plurality of fourth refracting surface regions including a contour with a center projecting in a fourth direction opposite to the third direction.

10. The optical integrator according to claim 9, wherein the contour of the plurality of third refracting surface regions and the contour of the plurality of fourth refracting surface regions are substantially symmetric with respect to the first direction.

11. The optical integrator according to claim 9, wherein at least either of the plurality of third refracting surface regions and the plurality of fourth refracting surface regions include a contour curved in an arcuate shape.

12. The optical integrator according to claim 11, wherein the contour curved in the arcuate shape corresponds to a contour of a partial region along a circumferential direction of an annular region.

13. The optical integrator according to claim 11, further comprising:
a plurality of deflecting surface regions corresponding to the plurality of refracting surface regions and adapted for changing a traveling direction of the incident light,
wherein the plurality of deflecting surface regions further comprise a plurality of third deflecting surface regions including a contour with a center projecting in the third direction corresponding to the plurality of third refracting surface regions, and a plurality of fourth deflecting surface regions including a contour with a center projecting in the fourth direction corresponding to the plurality of fourth refracting surface regions, and
wherein the plurality of third deflecting surface regions include a planar shape defined by a third normal inclined with respect to the third direction, and the plurality of fourth deflecting surface regions further include a planar shape defined by a fourth normal inclined with respect to the fourth direction and reversely to the third normal.

14. The optical integrator according to claim 9, wherein at least either of the plurality of third refracting surface regions and the plurality of fourth refracting surface regions include a contour bent in an arcuate shape.

15. The optical integrator according to claim 9, wherein a number of the plurality of third refracting surface regions is substantially equal to a number of the plurality of fourth refracting surface regions.

16. The optical integrator according to claim 1, comprising a plurality of deflecting surface regions provided corresponding to the plurality of refracting surface regions and adapted for changing a traveling direction of the incident light.

17. The optical integrator according to claim 16, wherein the plurality of refracting surface regions are formed on an entrance side of a single optical member, and
wherein the plurality of deflecting surface regions are formed on an exit side of the single optical member and are adapted to change the traveling direction of the light including passed through the plurality of refracting surface regions.

18. The optical integrator according to claim 16, wherein the plurality of deflecting surface regions comprise a plurality of first deflecting surface regions including a contour with a center projecting in the first direction corresponding to the plurality of first refracting surface regions, and a plurality of second deflecting surface regions including a contour with a center projecting in the second direction corresponding to the plurality of second refracting surface regions, and
wherein the plurality of first deflecting surface regions include a planar shape defined by a first normal inclined with respect to the first direction, and the plurality of second deflecting surface regions include a planar shape defined by a second normal inclined with respect to the second direction and reversely to the first normal.

19. The optical integrator according to claim 16, wherein the plurality of refracting surface regions further comprise a plurality of fifth refracting surface regions including a contour substantially different from the contours of the first and second refracting surface regions, and
wherein the plurality of deflecting surface regions further comprise a plurality of fifth deflecting surface regions including a contour corresponding to the plurality of fifth refracting surface regions and a planar shape substantially parallel to the first direction.

20. The optical integrator according to claim 16, wherein the plurality of deflecting surface regions are formed on an entrance side of a single optical member and adapted to change the traveling direction of the incident light, and
wherein the plurality of refracting surface regions are formed on an exit side of the single optical member so as to correspond to the plurality of deflecting surface regions.

21. The optical integrator according to claim 1, wherein each of the plurality of refracting surface regions includes a convex shape or a concave shape.

22. The optical integrator according to claim 1, wherein the plurality of refracting surface regions are formed on a single optical member, and
wherein the single optical member is made of a fluoride crystal material.

23. The optical integrator according to claim 22, said optical integrator being formed by processing a plane-parallel plate made of a fluoride crystal material.

24. The optical integrator according to claim 22, wherein the plurality of refracting surface regions are formed on a single optical member, and
wherein the single optical member is made of a fluoride crystal material of the cubic system and includes a crystal plane {111} directed to a traveling direction of the incident light.

25. The optical integrator according to claim 1, said optical integrator being made of an optical material with optical activity.

26. The optical integrator according to claim 25, wherein the optical material is rock crystal and a crystal optic axis of the rock crystal is matched with the traveling direction of the incident light.

27. An illumination optical apparatus which illuminates an illumination target surface on the basis of light from a light source, comprising:
the optical integrator as set forth in claim 1, which is disposed in an optical path between the light source and the illumination target surface.

28. The illumination optical apparatus according to claim 27, further comprising:
a second optical integrator disposed in an optical path of a beam from the optical integrator; and
a light-guide optical system which guides light from the second optical integrator to the illumination target surface in a superimposed manner.

29. The illumination optical apparatus according to claim 27, wherein the light source supplies a substantially parallel beam.

30. An exposure apparatus comprising the illumination optical apparatus as set forth in claim 27, which illuminates a predetermined pattern, said exposure apparatus being adapted to effect exposure of a photosensitive substrate with the predetermined pattern.

31. A device manufacturing method comprising:
exposing the photosensitive substrate with the predetermined pattern, using the exposure apparatus as set forth in claim 30; and
developing the photosensitive substrate after the exposing.

* * * * *